(12) United States Patent
Weissman et al.

(10) Patent No.: US 8,977,216 B2
(45) Date of Patent: Mar. 10, 2015

(54) LIMITED Q FACTOR TUNABLE FRONT END USING TUNABLE CIRCUITS AND MICROELECTROMECHANICAL SYSTEM (MEMS)

(75) Inventors: Haim M. Weissman, Haifa (IL); Avigdor Brillant, Zichron Ya'akov (IL); David Pezo, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 254 days.

(21) Appl. No.: 13/613,756

(22) Filed: Sep. 13, 2012

(65) Prior Publication Data

US 2013/0244591 A1   Sep. 19, 2013

Related U.S. Application Data

(60) Provisional application No. 61/612,890, filed on Mar. 19, 2012.

(51) Int. Cl.
| | |
|---|---|
| *H04B 1/40* | (2006.01) |
| *H04B 1/44* | (2006.01) |
| *H03H 9/46* | (2006.01) |
| *H04B 1/04* | (2006.01) |
| *H04B 1/18* | (2006.01) |
| *H03H 9/70* | (2006.01) |

(52) U.S. Cl.
CPC ............... *H04B 1/44* (2013.01); *H03H 9/462* (2013.01); *H04B 1/0458* (2013.01); *H04B 1/18* (2013.01); *H03H 9/70* (2013.01)
USPC ............... 455/77; 455/91; 455/120; 455/124; 455/130; 455/341; 330/286; 330/295

(58) Field of Classification Search
CPC ........... H04B 1/18; H04B 1/0458; H04B 1/44
USPC ........... 455/77, 78, 83, 306, 307, 73, 91, 120, 455/124, 125, 127.2, 127.3, 130, 191.1, 455/280, 281, 341; 330/286, 295
See application file for complete search history.

(56) References Cited

U.S. PATENT DOCUMENTS

| | | | |
|---|---|---|---|
| 6,535,766 | B1 | 3/2003 | Thompson et al. |
| 6,795,690 | B2 | 9/2004 | Weissman et al. |
| 7,676,244 | B2 | 3/2010 | Park et al. |

(Continued)

FOREIGN PATENT DOCUMENTS

| | | |
|---|---|---|
| EP | 1505682 A1 | 2/2005 |
| EP | 1670147 A2 | 6/2006 |

(Continued)

OTHER PUBLICATIONS

Partial International Search Report—PCT/US2013/033020—ISA/EPO—Jul. 5, 2013.

(Continued)

*Primary Examiner* — Tuan Pham

(57) ABSTRACT

A wireless device is described. The wireless device includes a tunable front end module. The tunable front end module includes a Tx microelectromechanical system bandpass filter. The tunable front end module also includes a first Rx microelectromechanical system bandpass filter. The wireless device also includes a power amplifier. The wireless device further includes a low noise amplifier.

62 Claims, 21 Drawing Sheets

(56) References Cited

U.S. PATENT DOCUMENTS

| | | |
|---|---|---|
| 2004/0043749 A1 | 3/2004 | Yamawaki et al. |
| 2004/0185795 A1* | 9/2004 | Shamsaifar et al. ............ 455/83 |
| 2006/0052124 A1 | 3/2006 | Pottenger et al. |
| 2006/0057959 A1 | 3/2006 | Vacanti et al. |
| 2007/0042802 A1* | 2/2007 | Park et al. .................. 455/552.1 |
| 2007/0049213 A1 | 3/2007 | Tran |
| 2009/0093270 A1 | 4/2009 | Block et al. |
| 2010/0029350 A1 | 2/2010 | Zhang |
| 2010/0238075 A1 | 9/2010 | Pourseyed |
| 2010/0261504 A1 | 10/2010 | Lukkarila |
| 2010/0316027 A1 | 12/2010 | Rick et al. |
| 2010/0321132 A1 | 12/2010 | Park |

FOREIGN PATENT DOCUMENTS

| | | |
|---|---|---|
| EP | 1755230 A2 | 2/2007 |
| JP | 2005167546 A | 6/2005 |
| JP | 2008252249 A | 10/2008 |

OTHER PUBLICATIONS

International Search Report and Written Opinion—PCT/US2013/033020—ISA/EPO—Sep. 12, 2013.

* cited by examiner

LIMITED Q FACTOR TUNABLE FRONT END USING TUNABLE CIRCUITS AND MICROELECTROMECHANICAL SYSTEM (MEMS)

CLAIM OF PRIORITY UNDER 35 U.S.C. 119

The present Application for patent claims priority to Provisional Application No. 61/612,890, entitled "NOVEL OPTIMIZED RFIC DISTRIBUTED MEMS BASED FRONT-END" filed Mar. 19, 2012, and assigned to the assignee hereof and hereby expressly incorporated by reference herein.

TECHNICAL FIELD

The present disclosure relates generally to wireless devices for communication systems. More specifically, the present disclosure relates to systems and methods for a limited Q factor tunable front end using tunable circuits and microelectromechanical system (MEMS) in devices.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

These electronic devices may communicate wirelessly with each other and with a network. As the demand for information by these electronic devices has increased, the downlink throughput has also increased. One such way to increase downlink throughput is the use of carrier aggregation. In carrier aggregation, multiple carriers may be aggregated on the physical layer to provide the required bandwidth (and thus the required throughput).

It may be desirable for an electronic device to maximize battery life. Because an electronic device often runs on a battery with a limited operation time, reductions in the power consumption of an electronic device may increase the desirability and functionality of the electronic device.

The electronic devices have also become smaller and cheaper. To facilitate both the decrease in size and the decrease in cost, additional circuitry and more complex circuitry are being used on integrated circuits. Thus, any reduction in the die area used by circuitry may reduce both the size and cost of an electronic device. Benefits may be realized by improvements to electronic devices that allow an electronic device to participate in carrier aggregation while minimizing the cost and size of the electronic device while also minimizing the power consumption of the electronic device.

SUMMARY

A wireless device is described. The wireless device includes a tunable front end module. The tunable front end module includes a Tx microelectromechanical system bandpass filter and a first Rx microelectromechanical system bandpass filter. The wireless device also includes a power amplifier. The wireless device further includes a low noise amplifier.

The tunable front end module may include a microelectromechanical system duplexer. The microelectromechanical system duplexer may include a first tunable filter for Tx and a second tunable filter for Rx. The first tunable filter and the second tunable filter may use microelectromechanical system technology. The power amplifier may be coupled between the Tx microelectromechanical system bandpass filter and the first tunable filter. The low noise amplifier may be coupled between the first Rx microelectromechanical system bandpass filter and the second tunable filter. The first tunable filter and the second tunable filter may be coupled to an antenna.

The wireless device may include a radio frequency integrated circuit that includes a driver amplifier and a post-LNA amplifier. The driver amplifier may be tunable to provide higher gain to narrower chunks of bandwidth. The post-LNA amplifier may also be tunable to provide higher gain to narrower chunks of bandwidth. The power amplifier may be integrated with the tunable front end module. The low noise amplifier may also be integrated with the tunable front end module.

The power amplifier may be a distributed gain power amplifier. The power amplifier may include a Tx driver integrated on a radio frequency integrated circuit, a low gain power amplifier, a Tx driver filter coupled between the Tx driver and the low gain power amplifier and a Tx filter coupled to an output of the low gain power amplifier.

The low noise amplifier may be a distributed gain low noise amplifier. The low noise amplifier may include a post-LNA amplifier integrated on a radio frequency integrated circuit, a low gain low noise amplifier, an Rx post-LNA filter coupled between the post-LNA amplifier and the low gain low noise amplifier and an Rx filter coupled to an input of the low gain low noise amplifier.

The low noise amplifier and the power amplifier may be integrated with the tunable front end module. The Tx microelectromechanical system bandpass filter and the first Rx microelectromechanical system bandpass filter may be integrated on a radio frequency integrated circuit. The low noise amplifier may also be integrated on the radio frequency integrated circuit. The power amplifier may be integrated on the radio frequency integrated circuit. The power amplifier may be tunable to provide higher gain to narrower chunks of bandwidth. The power amplifier may have higher efficiency and better matching to the antenna because an output filter is not used. The power amplifier may emit less, since the response of the power amplifier is the same as a bandpass filter.

The power amplifier may improve Rx/Tx isolation, since the bandwidth is narrower and rejection is increased. The low noise amplifier may be tunable to provide higher gain to narrower chunks of bandwidth. The low noise amplifier may allow for the relaxation of specifications for an input filter. The low noise amplifier may have higher efficiency and lower noise figures because the low noise amplifier is better matched to the input filter and since the specification for the input filter are relaxed. The low noise amplifier may have a response that is the same as a bandpass filter. The low noise amplifier may improve Rx/Tx isolation, since the bandwidth is narrower and rejection is increased.

The wireless device may include a microelectromechanical system RF switch and multiple Rx surface acoustic wave duplexers. The microelectromechanical system RF switch may couple the low noise amplifier to an antenna via one of the multiple Rx surface acoustic wave duplexers.

The wireless device may include a Tx band select microelectromechanical system switch and multiple Tx surface acoustic wave duplexers. The Tx band select microelectromechanical system switch may couple the power amplifier to the antenna via one of the multiple Tx surface acoustic wave duplexers.

The wireless device may include a first antenna. The wireless device may also include a second Rx microelectromechanical bandpass filter coupled between the first antenna and the first microelectromechanical bandpass filter. The wireless device may further include a second antenna coupled to an output of the power amplifier.

A method for wireless communications is also described. A receive signal is received. The receive signal is routed through a first Rx microelectromechanical bandpass filter in a tunable front end module. The receive signal is provided to a modem. A transmit signal is received from the modem. The transmit signal is routed through a Tx microelectromechanical bandpass filter in the tunable front end module. The transmit signal is transmitted.

The method may be performed by a wireless device that includes a tunable front end module. The tunable front end module may include a power amplifier and a low noise amplifier. The wireless device may be a wireless communication device or a base station.

An apparatus for wireless communications is described. The apparatus includes means for receiving a receive signal. The apparatus also includes means for routing the receive signal through a first Rx microelectromechanical bandpass filter in a tunable front end module. The apparatus further includes means for providing the receive signal to a modem. The apparatus also includes means for receiving a transmit signal from the modem. The apparatus further includes means for routing the transmit signal through a Tx microelectromechanical bandpass filter in the tunable front end module. The apparatus also includes means for transmitting the transmit signal.

A computer-program product for wireless communications is also described. The computer-program product includes a non-transitory computer-readable medium having instructions thereon. The instructions include code for causing a wireless device to receive a receive signal. The instructions also include code for causing the wireless device to route the receive signal through a first Rx microelectromechanical bandpass filter in a tunable front end module. The instructions further include code for causing the wireless device to provide the receive signal to a modem. The instructions also include code for causing the wireless device to receive a transmit signal from the modem. The instructions further include code for causing the wireless device to route the transmit signal through a Tx microelectromechanical bandpass filter in the tunable front end module. The instructions also include code for causing the wireless device to transmit the transmit signal.

DETAILED DESCRIPTION

Figure 1:
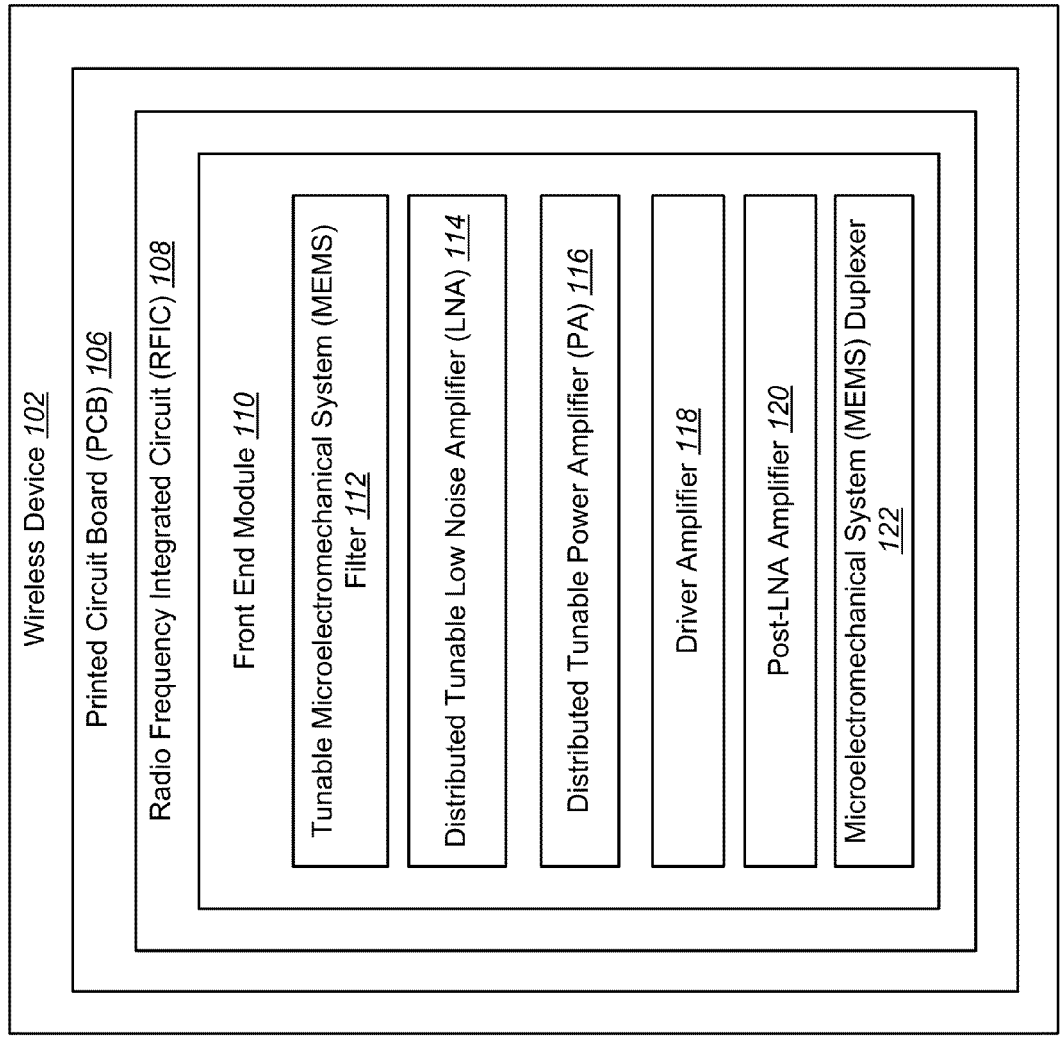
FIG. 1 shows a wireless device for use in the present systems and methods.

FIG. 1 shows a wireless device 102 for use in the present systems and methods. A wireless device 102 may be a wireless communication device or a base station. A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

A wireless communication device may operate in a wireless communication system that includes other wireless devices 102, such as base stations. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area, depending on the context in which the term is used.

Communications in a wireless communication system (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple (NT) transmit antennas and multiple (NR) receive antennas for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized.

The wireless communication system may utilize both single-input and multiple-output (SIMO) and multiple-input and multiple-output (MIMO). The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, $3^{rd}$ Generation Partnership Project (3GPP) Long Term Evolution (LTE) systems and spatial division multiple access (SDMA) systems.

The wireless device 102 may be used for both the transmission of wireless signals and the reception of wireless signals. Thus, the wireless device 102 may include a transmit (Tx) chain and a receive (Rx) chain. The transmit (Tx) chain may route signals generated by a modem through a transmitter to be transmitted by an antenna. Likewise, the receive (Rx) chain may route signals received by an antenna through a receiver to be decoded by a modem. Portions of the receive (Rx) chain and the transmit (Tx) chain may be located on a printed circuit board (PCB) 106 in the wireless device 102. In one configuration, portions of the receive (Rx) chain and the transmit (Tx) chain may be located on an integrated circuit on the printed circuit board (PCB) 106 (referred to as a radio frequency integrated circuit (RFIC) 108).

The wireless device 102 may include a front end module 110. The front end module 110 may refer to all the circuitry between the antenna and a first intermediate frequency (IF) stage. The front end module 110 may be located on the printed circuit board (PCB) 106. In one configuration, some or all of the front end module 110 may be located on the radio frequency integrated circuit (RFIC) 108. As used herein, a module is an external unit to the radio frequency integrated circuit (RFIC) 108 and a block is internal to the radio frequency integrated circuit (RFIC) 108.

Conventionally, in a multiband zero intermediate frequency (ZIF) or very low intermediate frequency (VLIF) architecture, the front end module 110 on a radio frequency integrated circuit (RFIC) 108 may include multiple low noise amplifiers (LNAs) and multiple power amplifier (PA) drivers that are coupled to the radio frequency integrated circuit (RFIC) 108 package pins. The radio frequency integrated circuit (RFIC) 108 pins may then be coupled to external components such as power amplifiers (PAs), duplexers, low noise amplifiers (LNAs), switches and an RF front end module. The external components naturally increase both the cost and area consumption of the printed circuit board (PCB) 106.

In some architectures, a power amplifier (PA) may be reused for multiple bands (thus requiring a low efficiency). This is because the power amplifier (PA) must maintain high power for a wide band. In other architectures, multiple power amplifiers (PAs) may be used for each band, leading to an increase in the cost and area consumption of the printed circuit board (PCB) 106.

Traditionally, the external power amplifier (PA) has a high gain and is cascaded directly to the PA-driver on the radio frequency integrated circuit (RFIC) 108. This may increase the Tx out-of-band noise level (e.g., the noise density). The additional noise may be filtered by the front end Tx filter. However, the additional noise may be reduced if the power amplifier (PA) gain and filtering is distributed differently such that the power amplifier (PA) bandwidth is tunable in chunks. In other words, the additional noise may be reduced if a tunable power amplifier (PA) is used in the wireless device. Stringent specifications of high rejection at the RF front end (RFFE) duplexer to prevent Rx compression and blocking by the Tx may result in high pass-band insertion-loss (IL). The insertion-loss (IL) may resemble an increase in the Rx noise figure (NF) and the Tx insertion loss (IL), causing an increase in the Tx power amplifier (PA) gain (resulting in an increase in the power consumption of the wireless device). Noise Figure (NF) is measured in decibels (dBs).

Excessive insertion loss (IL) in the radio frequency front end (RFFE) and the part count in the wireless device 102 may be reduced by the present systems and methods. Furthermore, problems associated with multiple front end modules may be mitigated using the present systems and methods. A typical radio frequency integrated circuit (RFIC) 108 structure may include excessive off-chip components and in-chip front end blocks such as multiple low noise amplifiers (LNAs) and Tx drivers. Thus, a typical radio frequency integrated circuit (RFIC) 108 structure may have non-optimal performance in terms of power consumption, noise-figure (NF), insertion loss (IL), degraded sensitivity, size and cost. The present systems and methods may improve the transmit/receive performance of the wireless device 102.

The wireless device 102 may include a tunable front end module 110. In one configuration, the tunable front end module 110 may be located on the radio frequency integrated circuit (RFIC) 108. In another configuration, the tunable front end module 110 may be located on the printed circuit board (PCB) 106 but not on the radio frequency integrated circuit (RFIC) 108. A tunable front end module 110 may make use of a microelectromechanical system (MEMS). A microelectromechanical system (MEMS) may include moving parts such that incoming signals generate voltages that produce an electrostatic force, causing parts within the microelectromechanical system (MEMS) to move to a new position based on the electrostatic field applied on a cantilever. This may include moving beams of RF switches or high Q air capacitors.

A microelectromechanical system (MEMS) may be used as a bandpass filter (BPF) to reject signals with certain frequencies while passing signals with other frequencies. One advantage of using a microelectromechanical system (MEMS) is that a microelectromechanical system (MEMS) allows the wireless device 102 to process signals with minimal interference and maximum transmission efficiency. Furthermore, a microelectromechanical system (MEMS) may use considerably less space on a printed circuit board (PCB) 106 and/or on a radio frequency integrated circuit (RFIC) 108. By using microelectromechanical system (MEMS) technology, filters may be tuned to cover the entire receive and transmit range, thus reducing the need for additional off-chip components.

In one configuration, a single tunable microelectromechanical system (MEMS) filter 112 along with a single distributed gain tunable power amplifier (PA) 116 and a single distributed gain tunable low noise amplifier (LNA) 114 can replace all off-chip parts as well as reduce the number of radio frequency integrated circuit (RFIC) 108 internal front end module 110 blocks. Thus, the wireless device 102 may include one or two tunable front end modules 110 and a radio frequency integrated circuit (RFIC) 108 with one or two tunable RF front end blocks such as a single internal low noise amplifier (LNA) (a post-LNA amplifier 120) and a single Tx driver amplifier 118. The front end module 110 may also include a microelectromechanical (MEMS) duplexer 122. The microelectromechanical (MEMS) duplexer 122 is discussed in additional detail below in relation to FIG. 4. Distributed gain power amplifiers (PAs) are discussed below in relation to FIG. 2. Tunable power amplifiers (PAs) are discussed below in relation to FIG. 12. Distributed gain low noise amplifiers (LNAs) are discussed below in relation to FIG. 3. Tunable low noise amplifiers (LNAs) are discussed below in relation to FIG. 11.

Figure 2:
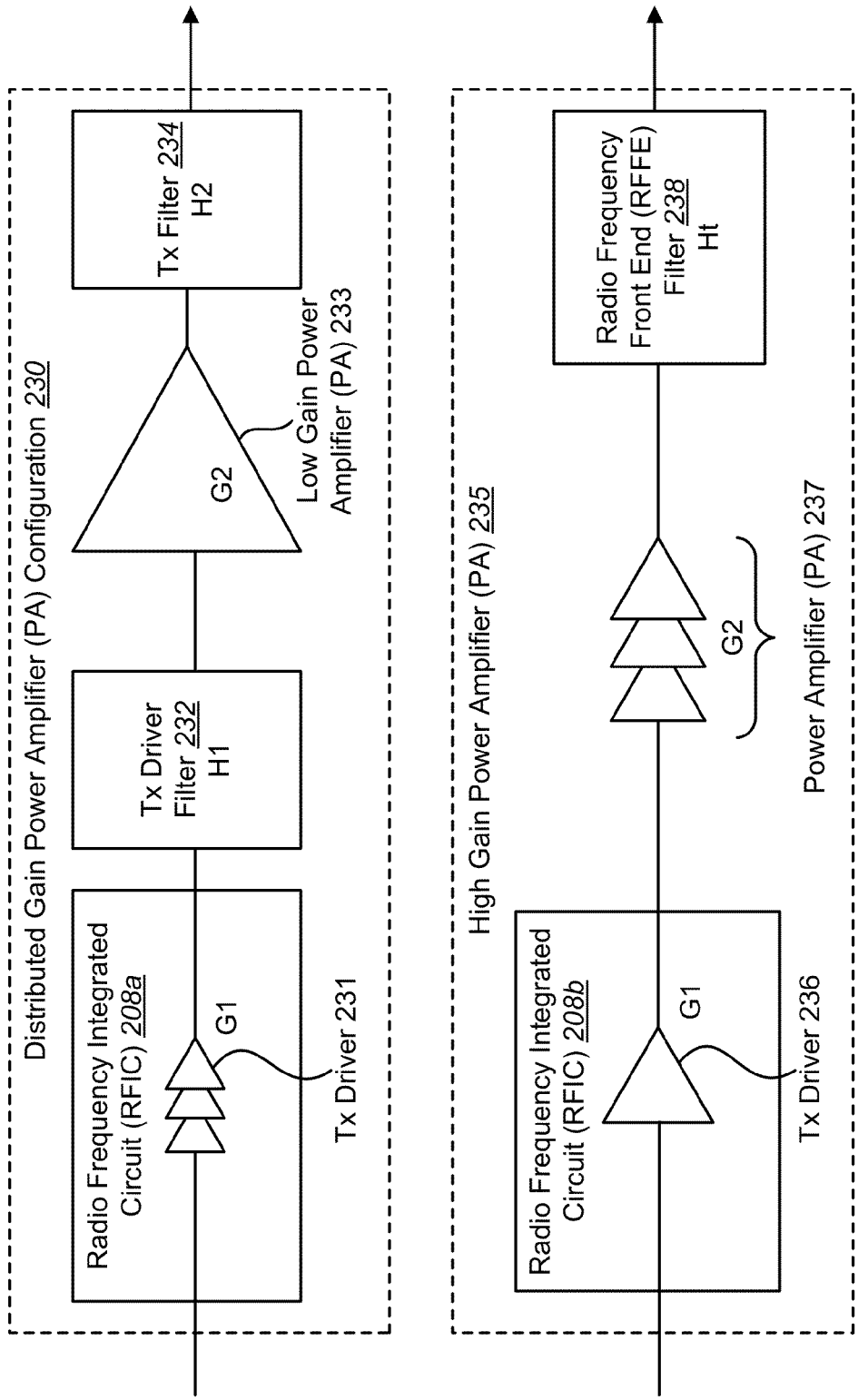
FIG. 2 is a block diagram illustrating a distributed gain power amplifier (PA) configuration and a high gain power amplifier (PA)

FIG. 2 is a block diagram illustrating a distributed gain power amplifier (PA) configuration 230 and a high gain power amplifier (PA) 235. Traditionally, the power amplifier (PA) 237 is directly coupled to the radio frequency integrated circuit (RFIC) 208b Tx driver 236 (as shown in the high gain power amplifier (PA) 235). The wideband noise density may be expressed using Equation (1):

$$N = kTFG + Pn(f)G. \quad (1)$$

In Equation (1), k is the Boltzmann constant, T is the temperature in Kelvin, F is the Tx chain equivalent noise-figure (NF) and G is the Tx gain. $Pn(f)$ is the phase noise density as a function of frequency. Equation (1) may be rewritten as Equation (2):

$$N = kTF_1G_1G_2 + kTF_2G_2 + Pn(f)G_1G_2. \quad (2)$$

In Equation (2), G1 is the Tx gain factor within the radio frequency integrated circuit (RFIC) 208b, F1 is the noise figure (NF) within the radio frequency integrated circuit (RFIC) 208b, G2 is the power amplifier (PA) 237 gain factor and G2 is the power amplifier (PA) 237 noise figure (NF). The noise may be filtered by the radio frequency front end (RFFE) filter 238 as described using Equation (3):

$$N_{out} = (kTF_1G_1G_2 + kTF_2G_2 + Pn(f)G_1G_2)H_t(f). \quad (3)$$

In Equation (3), Ht(f) is the radio frequency front end (RFFE) filter 238 response versus frequency. The radio frequency front end (RFFE) filter 238 may also reduce the undesired Tx harmonics and spurious signals created throughout the Tx chain. Harmonics and spurious signals generated within the radio frequency integrated circuit (RFIC) 208b are thus amplified by the external power amplifier (PA) 237 and additional harmonics are generated.

By distributing differently the Tx gain through the Tx chain and inserting a Tx inter-stage bandpass filter (BPF) filter (i.e., the Tx filter 234), the high gain power amplifier (PA) 235 may become a distributed gain power amplifier (PA) configuration 230. In the distributed gain power amplifier (PA) configuration 230, the wideband noise may be reduced, since the noise created by the radio frequency integrated circuit (RFIC) 208a and the Tx driver 231 is reduced by the inter-stage filter (i.e., the Tx driver filter 232) as described in Equation (4):

$$N_{out} = ((Pn(f)G_1 + kTF_1G_1)H_1(f)G_2 + kTF_2G_2)H_2(f). \quad (4)$$

In Equation (4), H1(f) is the inter-stage filter (i.e., the Tx driver filter 232) response versus frequency and H2(f) is the Tx filter 234 response versus frequency. In the distributed gain power amplifier (PA) configuration 230, the radio frequency integrated circuit (RFIC) 208a harmonics and spurious signals may be attenuated by the Tx driver filter 232 and further generation of undesired spurious signals within the power amplifier (PA) 233 may be minimized. The low gain power amplifier (PA) 233 has lower gain than the power amplifier (PA) 237, reducing the generation of undesired spurious signals within the distributed gain power amplifier (PA) configuration 230.

The Tx filter 234 may require less stringent rejection specifications, resulting in a reduced insertion loss (IL). A lower insertion loss (IL) results in a lower required power amplifier (PA) gain G2, resulting in reduced power consumption, as described in Equation (5):

$$H_1(f) + H_2(f) < H_t(f). \quad (5)$$

In Equation (5), Ht(f) is the filter response versus frequency of a radio frequency front end (RFFE) filter 238 used in conventional Tx design. In Equation (5), H1(f), H2(f) and Ht(f) are expressed in decibels (dB). Because the power amplifier (PA) gain G2 of the low gain power amplifier (PA) 233 is lower, the low gain power amplifier (PA) 233 is less susceptible to oscillation and emitting noise on the printed circuit board (PCB) 106 than the power amplifier (PA) 237.

The gain values used in the distributed gain power amplifier (PA) configuration 230 are different than the gain values used in the high gain power amplifier (PA) 235. In the distributed gain power amplifier (PA) configuration 230, the power amplifier (PA) gain is reduced and the Tx driver 231 gain is increased to an optimum level. In addition, the Tx driver filter 232 and the Tx filter 234 have an optimized shape-factor that provides the required rejection while minimizing insertion loss (IL). Thus, a distributed gain power amplifier (PA) configuration 230 has advantages over a high gain power amplifier (PA) 235.

Figure 3:
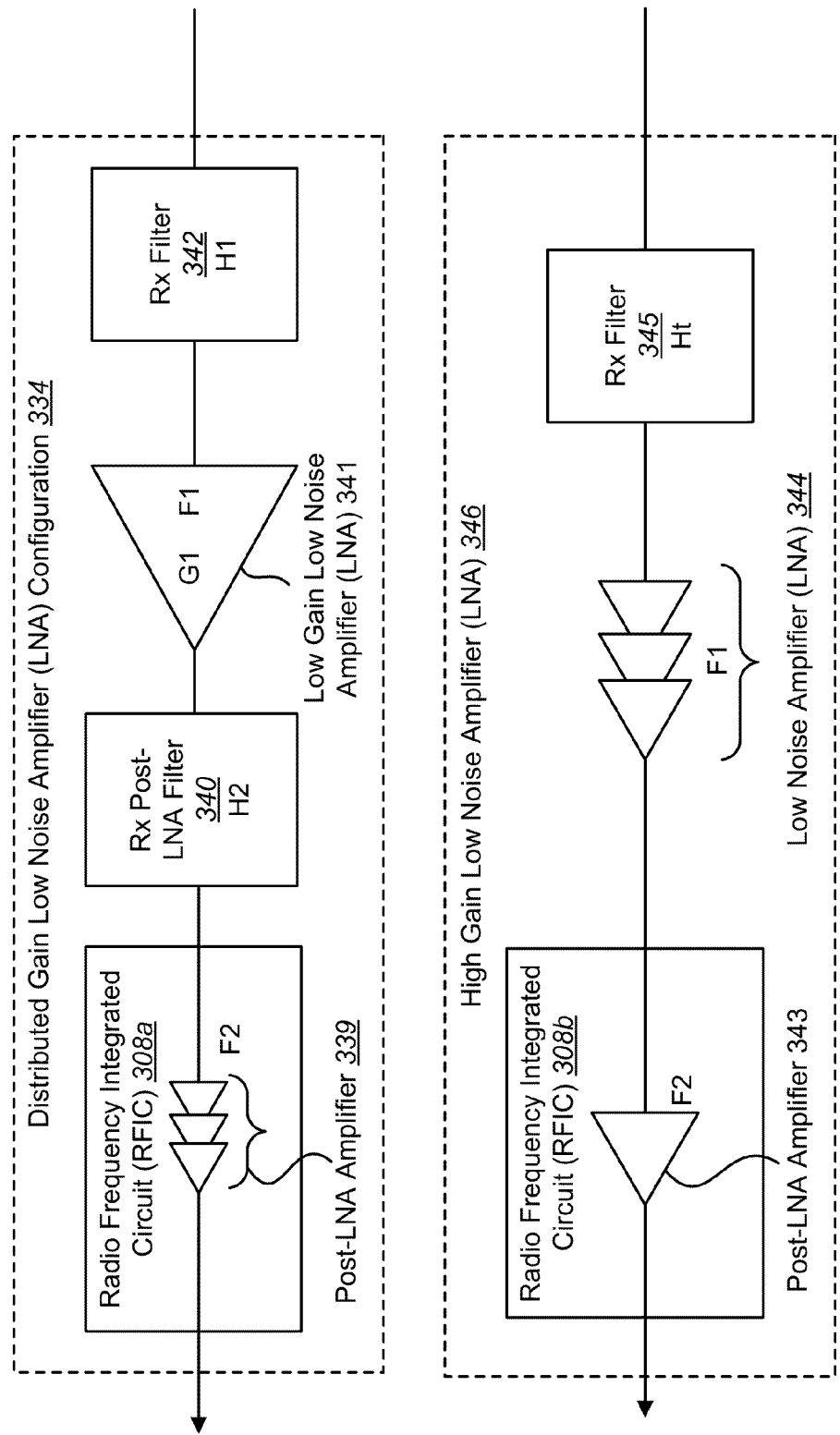
FIG. 3 is a block diagram illustrating a distributed gain low noise amplifier (LNA) configuration and a high gain low noise amplifier (LNA)

FIG. 3 is a block diagram illustrating a distributed gain low noise amplifier (LNA) configuration 334 and a high gain low noise amplifier (LNA) 346. Traditionally, the low noise amplifier (LNA) 344 is coupled directly to the post-LNA amplifier 343 in the radio frequency integrated circuit (RFIC) 308b (as shown in the high gain low noise amplifier (LNA) 346). As a result, the third order intercept point (IP3) of the receive (Rx) chain is low. This is because the low noise amplifier (LNA) 344 has a high gain. The specifications for the Rx filter 345 (a radio frequency front end (RFFE) bandpass filter (BPF)) are for strong rejection, resulting in higher insertion loss (IL) that inherently increases the Rx noise figure (NF). The noise figure (NF) in dB=10 log F.

In the distributed gain low noise amplifier (LNA) configuration 334, the Rx filter 342 is coupled to a low gain low noise amplifier (LNA) 341. The output of the low gain low noise amplifier (LNA) 341 is coupled to an Rx post-LNA filter 340. The output of the Rx post-LNA filter 340 is coupled to a high gain post-LNA amplifier 339 that includes multiple cascaded amplifier stages on the radio frequency integrated circuit (RFIC) 308*a*. The distributed gain low noise amplifier (LNA) configuration 334 may have higher immunity against out-of-band jammers and Tx blocking, since the Rx filter 342 rejects jammers and Tx blocking and the input stage low noise amplifier (LNA) (i.e., the low gain low noise amplifier (LNA) 341) has a lower gain. For the signals and jammers at the Rx post-LNA filter 340, if the signal is within the bandwidth of the Rx post-LNA filter 340, insertion loss (IL) only occurs while the jammer is further attenuated, therefore protecting the post-LNA amplifiers 339 within the radio frequency integrated circuit (RFIC) 308*a*. As a consequence, the overall third order intercept point (IP3) is improved. This is because the low gain low noise amplifier (LNA) 341 has a lower gain and the RFFE Rx filter 342 is placed at the input of the low gain low noise amplifier (LNA) 341. Hence, jammers are attenuated and the leaking energy of jammers is amplified using a low gain low noise amplifier (LNA) 341 instead of a high gain low noise amplifier (LNA) 344. The Rx post-LNA filter 340 may further attenuate the jammers. Thus, the post-LNA amplifier 339, which has a high gain compared to the low gain low noise amplifier (LNA) 341, does not amplify high energy jammers, unlike the high gain low noise amplifier (LNA) 346, which does amplify high energy jammers.

Since the Rx filter 342 has lower insertion loss (IL) due to relaxation in the specifications, the distributed gain low noise amplifier (LNA) configuration 334 has an improved noise figure (NF) and sensitivity according to Equation (6):

$$F = H_1(f) + \frac{(F_1 - 1)}{H_1(f)} + \frac{(H_2(f) - 1)}{G_1 H_1(f)} + \frac{(F_2 - 1)}{G_1 H_1(f) H_2(f)}. \quad (6)$$

In Equation (6), H1($f$) is the Rx filter 342 response versus frequency, H2($f$) is the Rx post-LNA filter 340 response versus frequency, G1 is the gain of the low gain low noise amplifier (LNA) 341, F1 is the noise figure (NF) of the low gain low noise amplifier (LNA) 341 and F2 is the post-LNA amplifiers 339 noise figure (NF). In Equation (6), $0 < H_1(f) < 1$ and $0 < H_2(f) < 1$, where an ideal filter has a response equal to 1. Thus, it can be seen that moderate filter insertion loss (IL) adds directly to the noise figure (NF) of the low gain low noise amplifier (LNA) 341, creating lower performance reduction as compared to a higher insertion loss (IL) Rx filter 345, where the insertion loss is added to the low noise amplifier (LNA) 344. Moreover, the low gain low noise amplifier (LNA) 341 in the distributed gain low noise amplifier (LNA) configuration 334 may compensate the rest of the Rx chain noise according to the third and fourth terms of Equation (6). Thus, noise figure (NF) improvement is accomplished in addition to improvements to the third order intercept point (IP3). The noise figure (NF) gain due to the insertion loss (IL) in the Rx filter 342 is described in Equation (7):

$$H_1(f) + H_2(f) < H_t(f). \quad (7)$$

In Equation (7), Ht(f) is the filter response versus frequency of an Rx filter 345 used in conventional Rx design (e.g., a high gain low noise amplifier (LNA) 346). In Equation (5), H1($f$), H2($f$) and Ht(f) are expressed in decibels (dB); this means that the overall low noise amplifier (LNA) gain budget in the distributed gain low noise amplifier (LNA) configuration 334 is potentially lower, resulting in saved power.

Figure 4:
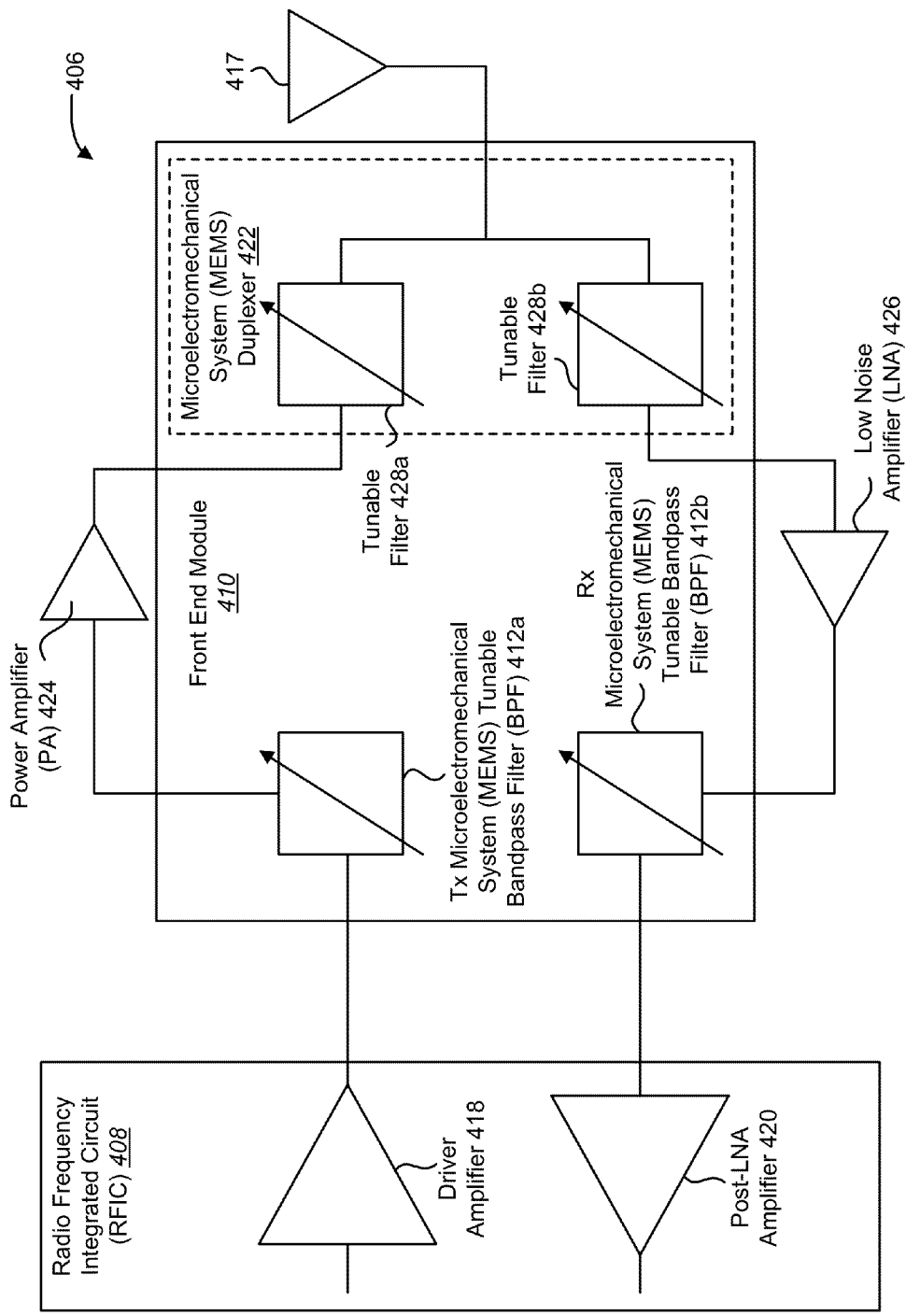
FIG. 4 is a block diagram illustrating one configuration of a tunable front end module and a radio frequency integrated circuit (RFIC) on a printed circuit board (PCB)

FIG. 4 is a block diagram illustrating one configuration of a tunable front end module 410 and a radio frequency integrated circuit (RFIC) 408 on a printed circuit board (PCB) 406. The aim of radio frequency integrated circuit (RFIC) 408 radio integration is to minimize the number of off-chip components and provide a modular approach using a tunable front end module 410. The tunable front end module 410 may use microelectromechanical system (MEMS) technology and provide improved performance.

The tunable front end module 410 may include a microelectromechanical system (MEMS) duplexer 422 coupled to an antenna 417. The microelectromechanical system (MEMS) duplexer 422 may include a first tunable filter 428*a* for the Tx chain and a second tunable filter 428*b* for the Rx chain. Both the first tunable filter 428*a* and the second tunable filter 428*b* may use microelectromechanical system (MEMS) technology. The first tunable filter 428*a* may be coupled to the output of a power amplifier (PA) 424 that is not part of the front end module 410. The power amplifier (PA) 424 may be the low gain power amplifier (PA) 233 as used in the distributed gain power amplifier (PA) configuration 230. The input of the power amplifier (PA) 424 may be coupled to a Tx microelectromechanical system (MEMS) tunable bandpass filter (BPF) 412*a*. The input of the Tx microelectromechanical system (MEMS) tunable bandpass filter (BPF) 412*a* may be coupled to the output of a driver amplifier 418 on the radio frequency integrated circuit (RFIC) 408. Thus, this configuration represents the distributed gain power amplifier (PA) configuration 230.

The second tunable filter 428*b* may be coupled to the input of a low noise amplifier (LNA) 426 that is not part of the front end module 410. The low noise amplifier (LNA) 426 may be the low gain low noise amplifier (LNA) 341 in a distributed gain low noise amplifier (LNA) configuration 334. The output of the low noise amplifier (LNA) 426 may be coupled to an Rx microelectromechanical system (MEMS) tunable bandpass filter (BPF) 412*b*. The output of the Rx microelectromechanical system (MEMS) tunable bandpass filter (BPF) 412*b* may be coupled to a post-LNA amplifier 420 on the radio frequency integrated circuit (RFIC) 408. Thus, this configuration represents the distributed gain low noise amplifier (LNA) configuration 334.

Figure 5:
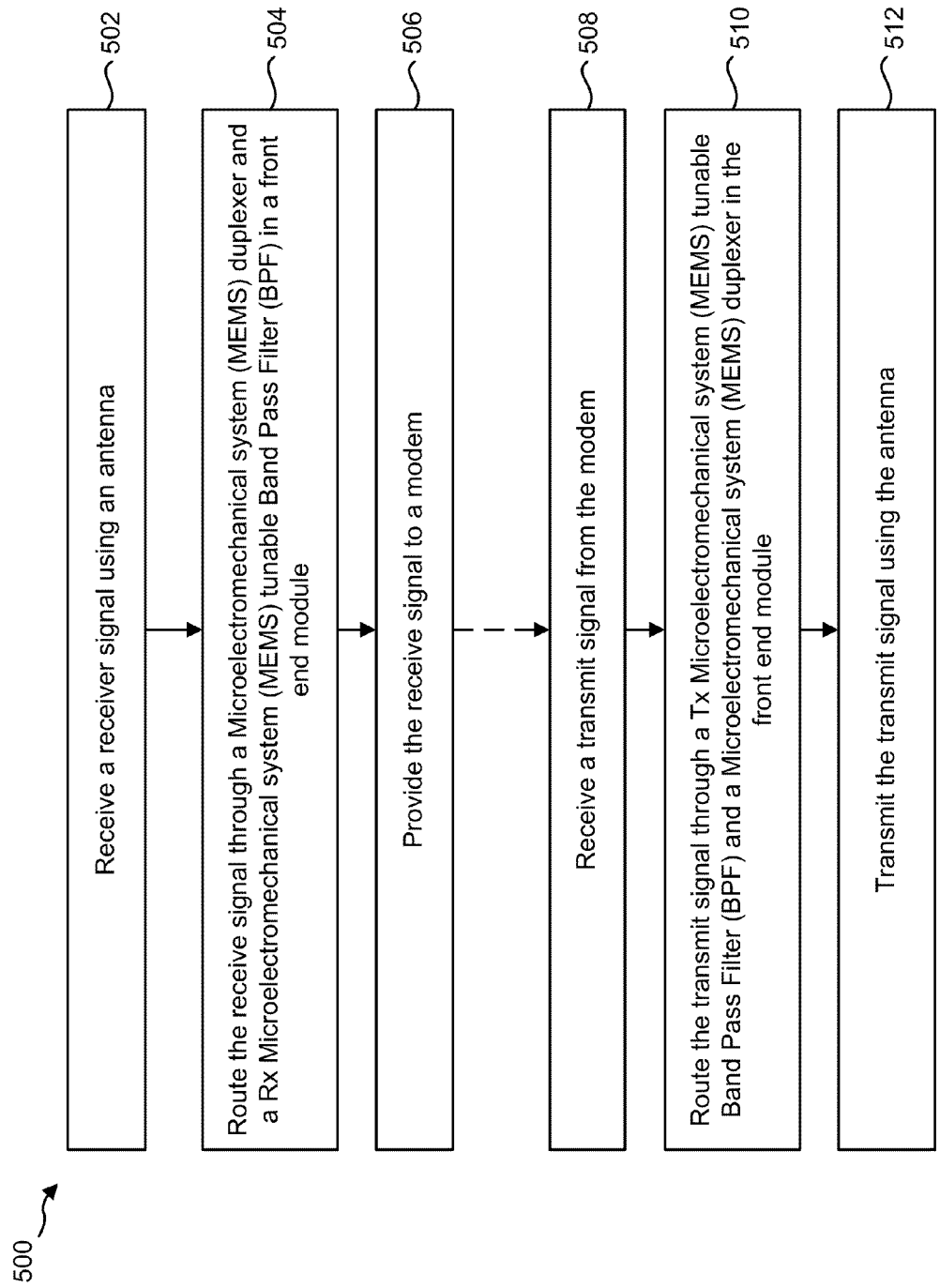
FIG. 5 is a flow diagram of a method for using microelectromechanical system (MEMS) filters in a tunable front end module.

FIG. 5 is a flow diagram of a method 500 for using microelectromechanical system (MEMS) filters 412 in a tunable front end module 410. The method 500 may be performed by a wireless device 102. The wireless device 102 may be a wireless communication device or a base station. The wireless device 102 may receive 502 a receive signal using an antenna 417. The wireless device 102 may route 504 the receive signal through a microelectromechanical system (MEMS) duplexer 422 and a Rx microelectromechanical system (MEMS) tunable bandpass filter (BPF) 412*b* in a front end module 410. The wireless device 102 may provide 506 the receive signal to a modem.

The wireless device 102 may also receive 508 a transmit signal from the modem. The wireless device 102 may route 510 the transmit signal through a Tx microelectromechanical system (MEMS) tunable bandpass filter (BPF) 412*a* and the microelectromechanical system (MEMS) duplexer 422 in the front end module 410. The wireless device 102 may transmit 512 the transmit signal using the antenna 417.

Figure 6:
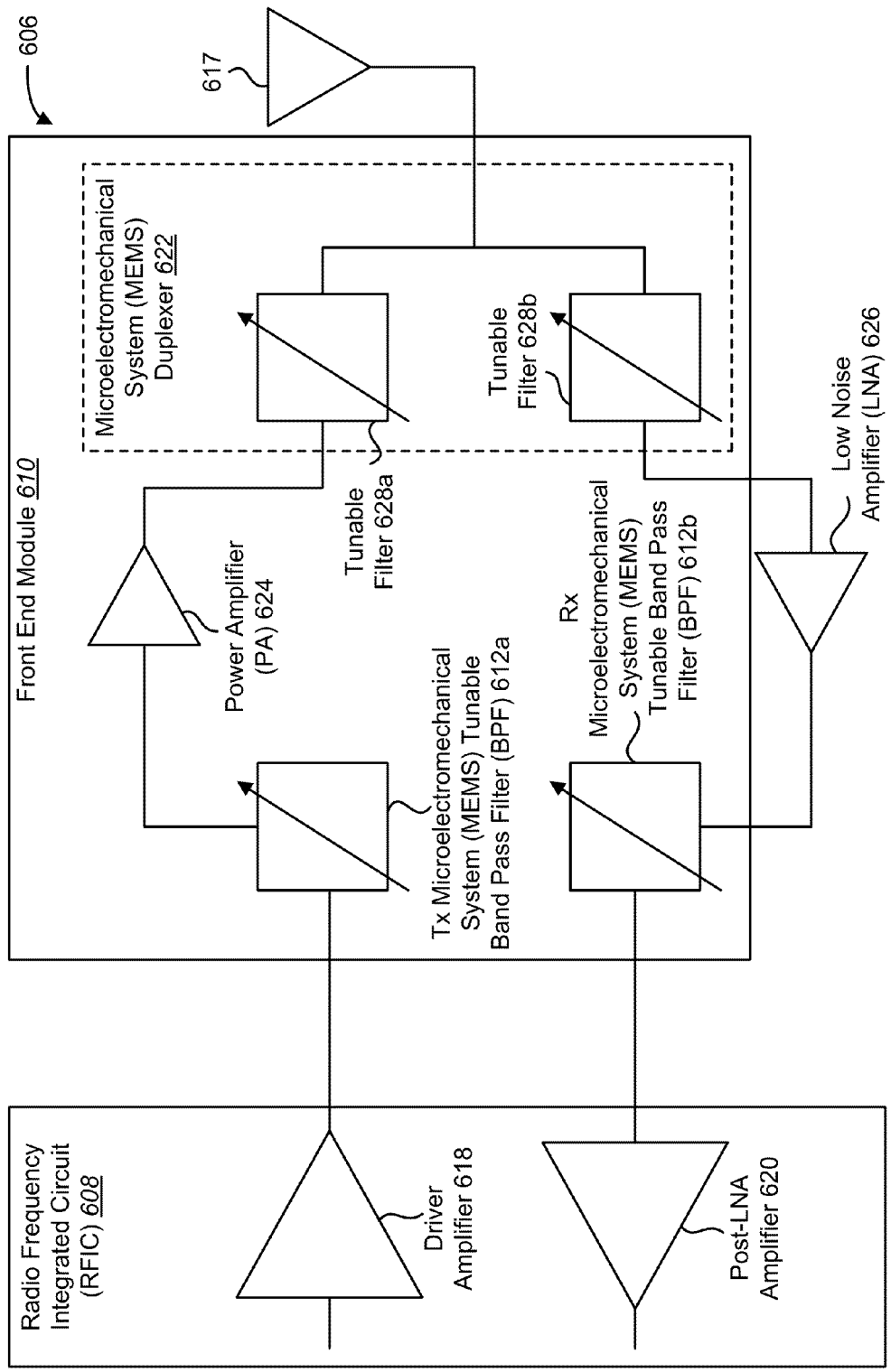
FIG. 6 is a block diagram illustrating a tunable front end module with an integrated power amplifier (PA)

FIG. 6 is a block diagram illustrating a tunable front end module 610 with an integrated power amplifier (PA) 624. The tunable front end module 610 and a radio frequency integrated circuit (RFIC) 608 may be located on a printed circuit board (PCB) 606. The tunable front end module 610 may include a microelectromechanical system (MEMS) duplexer 622 coupled to an antenna 617. The microelectromechanical system (MEMS) duplexer 622 may include a first tunable filter 628a for the Tx chain and a second tunable filter 628b for the Rx chain. Both the first tunable filter 628a and the second tunable filter 628b may use microelectromechanical system (MEMS) technology. The first tunable filter 628a may be coupled to the output of a power amplifier (PA) 624 that is integrated into the front end module 610. The power amplifier (PA) 624 may use a distributed gain power amplifier (PA) configuration 230. The input of the power amplifier (PA) 624 may be coupled to a Tx microelectromechanical system (MEMS) tunable bandpass filter (BPF) 612a. The input of the Tx microelectromechanical system (MEMS) tunable bandpass filter (BPF) 612a may be coupled to the output of a driver amplifier 618 within the radio frequency integrated circuit (RFIC) 608.

The second tunable filter 628b may be coupled to the input of a low noise amplifier (LNA) 626 that is not part of the front end module 610. The low noise amplifier (LNA) 626 may be part of a distributed gain low noise amplifier (LNA) configuration 334. The output of the low noise amplifier (LNA) 626 may be coupled to an Rx microelectromechanical system (MEMS) tunable bandpass filter (BPF) 612b. The output of the Rx microelectromechanical system (MEMS) tunable bandpass filter (BPF) 612b may be coupled to a post-LNA amplifier 620 within the radio frequency integrated circuit (RFIC) 608. Thus, this configuration represents the distributed low noise amplifier (LNA) configuration 334.

Figure 7:
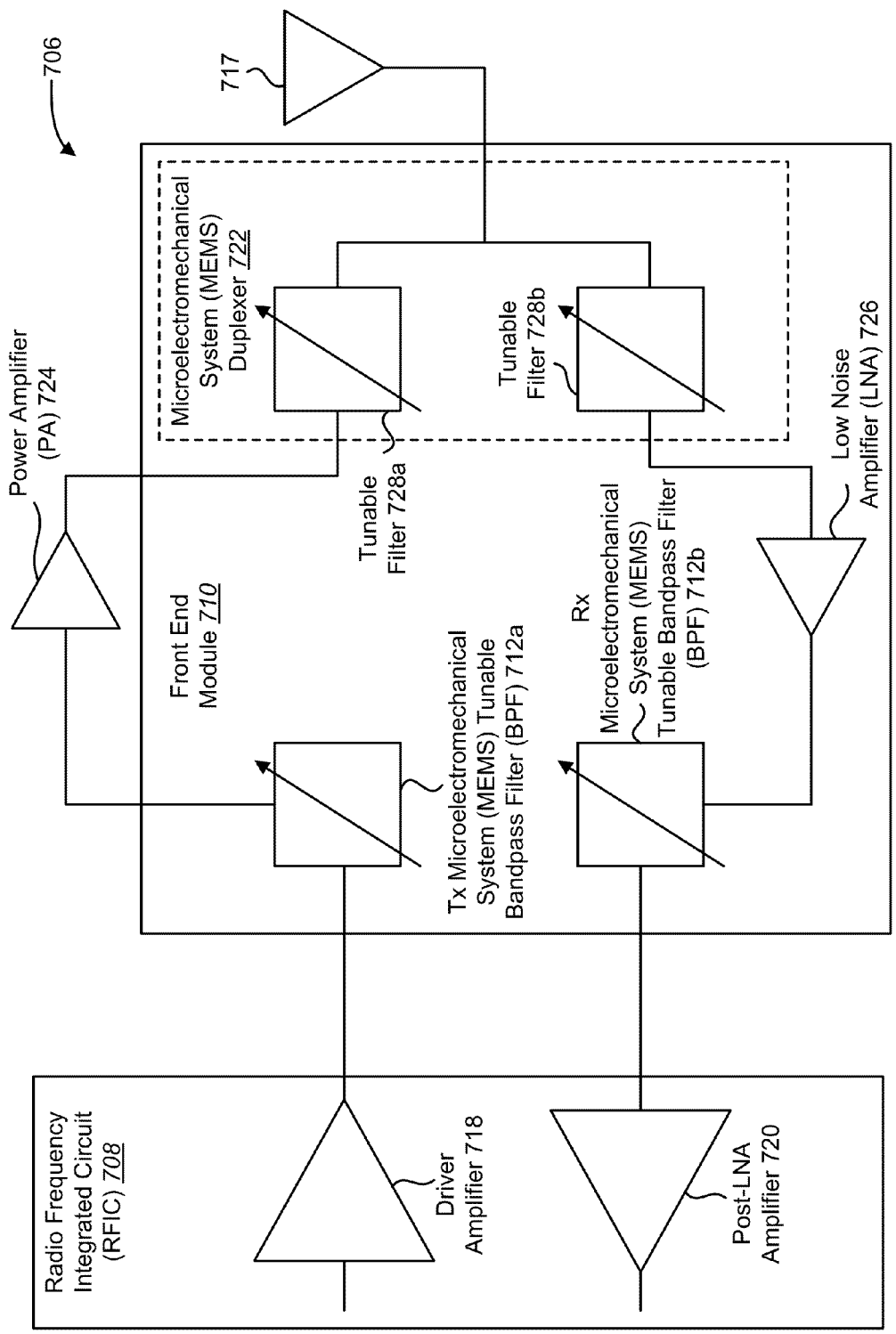
FIG. 7 is a block diagram illustrating a front end module with an integrated low noise amplifier (LNA)

FIG. 7 is a block diagram illustrating a front end module 710 with an integrated low noise amplifier (LNA) 726. The tunable front end module 710 and a radio frequency integrated circuit (RFIC) 708 may be located on a printed circuit board (PCB) 706. The low noise amplifier (LNA) 726 may be integrated into the front end module 710 while the power amplifier (PA) 724 is external to the front end module 710 to increase isolation between the power amplifier (PA) 724 and the low noise amplifier (LNA) 726. The front end module 710 may include a microelectromechanical system (MEMS) duplexer 722 coupled to an antenna 717. The microelectromechanical system (MEMS) duplexer 722 may include a first tunable filter 728a for the Tx chain and a second tunable filter 728b for the Rx chain. Both the first tunable filter 728a and the second tunable filter 728b may use microelectromechanical system (MEMS) technology.

The first tunable filter 728a may be coupled to the output of a power amplifier (PA) 724 that is not part of the front end module 710. The power amplifier (PA) 724 may be part of a distributed gain power amplifier (PA) configuration 230. The input of the power amplifier (PA) 724 may be coupled to a Tx microelectromechanical system (MEMS) tunable bandpass filter (BPF) 712a which is within the front end module (FEM) 710 (similar to the Tx driver filter 232 that is coupled to the low gain power amplifier (PA) 233 in the distributed gain power amplifier (PA) configuration 230). The input of the Tx microelectromechanical system (MEMS) tunable bandpass filter (BPF) 712a may be coupled to the output of a driver amplifier 718 within the radio frequency integrated circuit (RFIC) 708.

The second tunable filter 728b may be coupled to the input of a low noise amplifier (LNA) 726 that is integrated into the front end module 710. The low noise amplifier (LNA) 726 may be a low gain low noise amplifier (LNA) 341 that is part of a distributed gain low noise amplifier (LNA) configuration 334. The output of the low noise amplifier (LNA) 726 may be coupled to an Rx microelectromechanical system (MEMS) tunable bandpass filter (BPF) 712b. The output of the Rx microelectromechanical system (MEMS) tunable bandpass filter (BPF) 712b may be coupled to a post-LNA amplifier 720 within the radio frequency integrated circuit (RFIC) 708.

Figure 8:
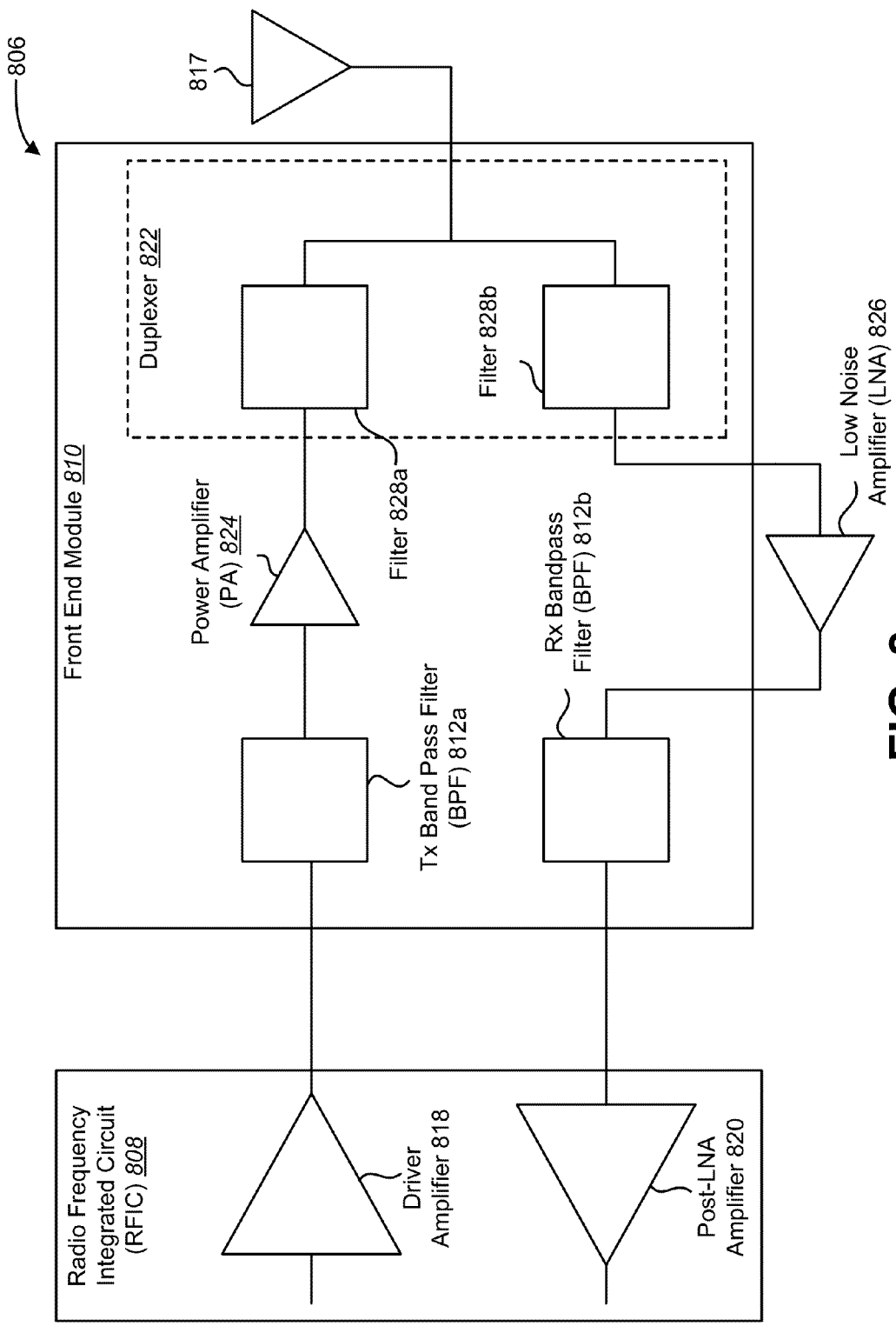
FIG. 8 is a block diagram illustrating a front end module with an integrated power amplifier (PA)

FIG. 8 is a block diagram illustrating a front end module 810 with an integrated power amplifier (PA) 824. The front end module 810 and a radio frequency integrated circuit (RFIC) 808 may be located on a printed circuit board (PCB) 806. By integrating the power amplifier (PA) 824 with the front end module 810 and keeping the low noise amplifier (LNA) 826 external to the front end module 810, losses between the power amplifier (PA) 824 and filters may be reduced at the expense of some reduction in the noise figure (NF) of the receiver due to the external connection between the front end module 810 and the low noise amplifier (LNA) 826. The power amplifier (PA) 824 and the low noise amplifier (LNA) 826 may be separated to increase Rx/Tx isolation. However, a front end module 810 with both the power amplifier (PA) 824 and the low noise amplifier (LNA) 826 integrated may be achieved under conditions of high isolation between the power amplifier (PA) 824 and the low noise amplifier (LNA) 826 (e.g., in cases where both the power amplifier (PA) 824 and the low noise amplifier (LNA) 826 are tunable (for example, having a tunable bandwidth and a center frequency that is narrower as compared to conventional wideband solutions)).

The front end module 810 may not be tunable. Integrating the power amplifier (PA) 824 into the front end module 810 may optimize the Rx/Tx lineup but will not reduce the number of off-chip components. Additionally, integrating the power amplifier (PA) 824 into the front end module 810 does not obtain the performance optimizations that may be achieved by implementing microelectromechanical system (MEMS) technology into the front end module 810 to tune filters to chunks of the whole bandwidth.

The front end module 810 may include a duplexer 822 coupled to an antenna 817. In one configuration, the duplexer 822 may be based on surface acoustic wave (SAW) or bulk acoustic wave (BAW) technology. This may add some relaxation on the radio frequency front end (RFFE) duplexer and add selectivity. The duplexer 822 may include a first filter 828a for the Tx chain and a second filter 828b for the Rx chain. The first filter 828a may be coupled to the output of a power amplifier (PA) 824 that is integrated with the front end module 810. The power amplifier (PA) 824 may be the low gain power amplifier (PA) 233 in a distributed gain power amplifier (PA) configuration 230. The input of the power amplifier (PA) 824 may be coupled to a Tx bandpass filter (BPF) 812a. The input of the Tx bandpass filter (BPF) 812a may be coupled to the output of a driver amplifier 818 within the radio frequency integrated circuit (RFIC) 808.

The second filter 828b may be coupled to the input of a low noise amplifier (LNA) 826 that is not part of the front end module 810. The low noise amplifier (LNA) 826 may be low gain low noise amplifier (LNA) 341 used in a distributed gain low noise amplifier (LNA) configuration 334. The output of the low noise amplifier (LNA) 826 may be coupled to an Rx bandpass filter (BPF) 812b input. The output of the Rx bandpass filter (BPF) 812b may be coupled to a post-LNA amplifier 820 within the radio frequency integrated circuit (RFIC) 808. In another configuration (not shown), the low noise amplifier (LNA) 826 may be integrated with the front end module 810 and the power amplifier (PA) 824 may not be part of the front end module 810. In yet another configuration (not shown), the low noise amplifier (LNA) 826, the power amplifier (PA) 824 and the Rx bandpass filter (BPF) 812b may not be part of the front end module 810.

Figure 9:
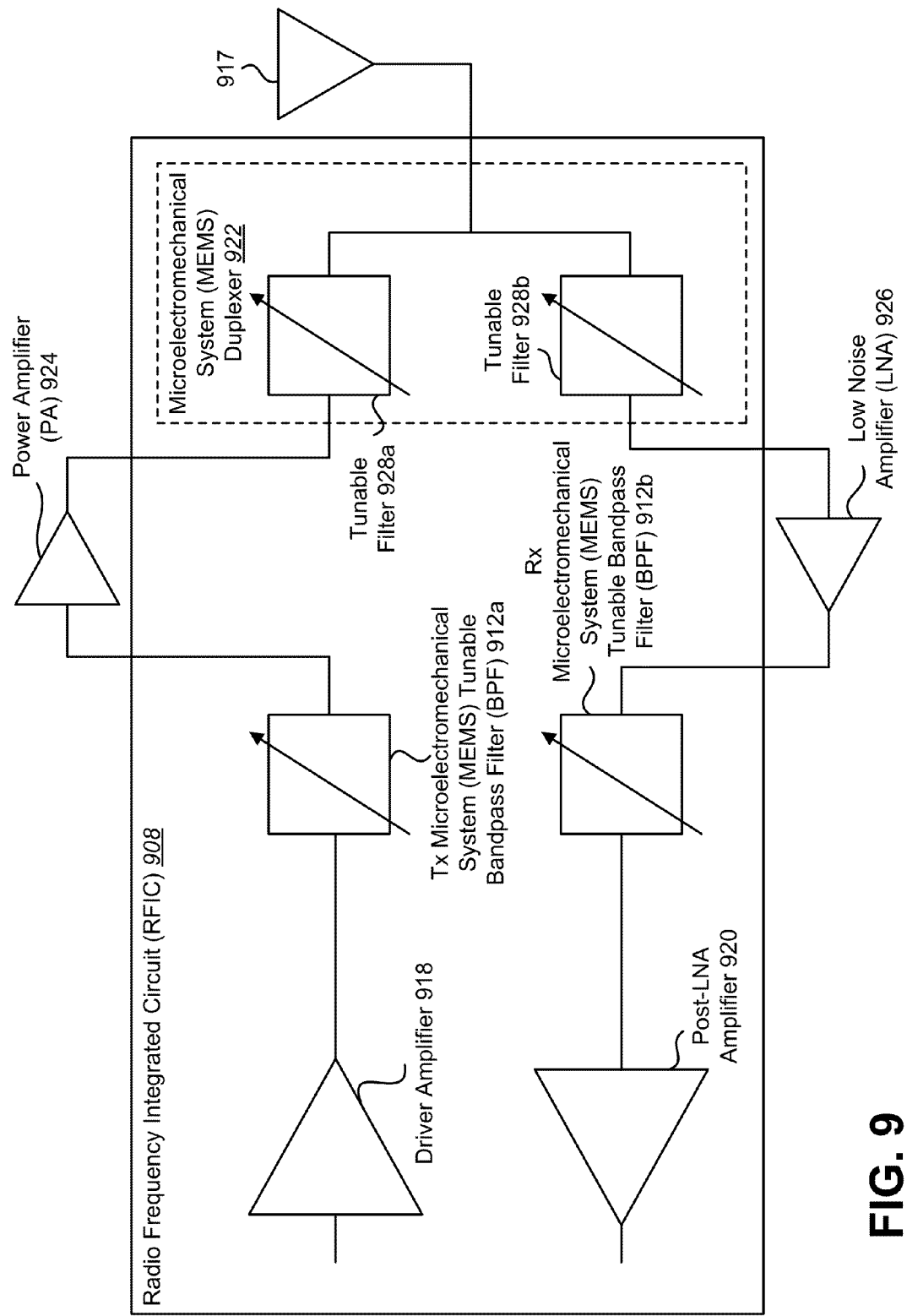
FIG. 9 is a block diagram illustrating a radio frequency integrated circuit (RFIC), where a portion of the front end module has been integrated into the radio frequency integrated circuit (RFIC)

FIG. 9 is a block diagram illustrating a radio frequency integrated circuit (RFIC) 908, where a portion of the front end module 110 has been integrated into the radio frequency integrated circuit (RFIC) 908. By integrating some or all of the front end module 110 on the radio frequency integrated circuit (RFIC) 908, the number of off-chip parts may be reduced. Adding tunability to the Tx driver amplifier 918 may improve Tx noise rejection, gain optimization and RF power matching; the power efficiency of the Tx driver amplifier 918 may also be improved.

The front end module 110 may include a power amplifier (PA) 924 and a low noise amplifier (LNA) 926 that are not integrated on the radio frequency integrated circuit (RFIC) 908. The front end module 110 may include a microelectromechanical system (MEMS) duplexer 922 coupled to an antenna 917. The microelectromechanical system (MEMS) duplexer 922 may include a first tunable filter 928a for the Tx chain and a second tunable filter 928b for the Rx chain. Both the first tunable filter 928a and the second tunable filter 928b may use microelectromechanical system (MEMS) technology. The first tunable filter 928a may be coupled to the output of the power amplifier (PA) 924 that is not integrated with the radio frequency integrated circuit (RFIC) 908. The power amplifier (PA) 924 may be the low gain power amplifier (PA) 233 used in a distributed gain power amplifier (PA) configuration 230. The input of the power amplifier (PA) 924 may be coupled to a Tx microelectromechanical system (MEMS) bandpass filter (BPF) 912a. The input of the Tx microelectromechanical system (MEMS) bandpass filter (BPF) 912a may be coupled to the output of a driver amplifier 918 within the radio frequency integrated circuit (RFIC) 908.

The second tunable filter 928b may be coupled to the input of the low noise amplifier (LNA) 926 that is not integrated with the radio frequency integrated circuit (RFIC) 908. The low noise amplifier (LNA) 926 may be a low gain low noise amplifier (LNA) 341 used in a distributed gain low noise amplifier (LNA) configuration 334. The output of the low noise amplifier (LNA) 926 may be coupled to an Rx microelectromechanical system (MEMS) bandpass filter (BPF) 912b. The output of the Rx microelectromechanical system (MEMS) bandpass filter (BPF) 912b may be coupled to a post-LNA amplifier 920 within the radio frequency integrated circuit (RFIC) 908.

Adding tunability to the post-LNA amplifier 920 may improve selectivity, the noise figure (NF), matching and gain. Adding tunability to the low noise amplifier (LNA) 926 and the power amplifier (PA) 924 may make the front end module 110 a complete tunable front end. A tunable low noise amplifier (LNA) 926 may have improved gain and noise figure (NF); moreover, having a tunable matching between the low noise amplifier (LNA) 926 input and the tunable filter 928b output will further improve the noise figure (NF) of the low noise amplifier (LNA) 926. A tunable power amplifier (PA) 924 may be better optimized to power matching and the Tx out-of-band noise may be reduced. Furthermore, a tunable power amplifier (PA) 924 may have lower power consumption. Additionally, tuning the power amplifier (PA) 924 for antenna matching may improve performance even further in terms of noise figure (NF), power matching, gain, duplexer performance and a further reduction in power consumption. Thus, the receiver performance and the efficiency are improved. This is because the out-of-band noise of the power amplifier (PA) 924 leaking to the receiver is reduced. Hence, the total noise power may be lower and the effective noise figure (NF) is improved. Having an optimized tuning of the power amplifier (PA) 924 may improve power saving by drawing lower current and reduce leakage of noise power, improving the effective noise figure (NF).

Using a tuned low noise amplifier (LNA) and a tuned power amplifier (PA) is one way to optimize performance while narrowing the bandwidth (BW). This essentially improved undesired noise emissions on the Tx path, optimizes power load matching and efficiency, optimizes gain and improves efficiency. The same is true for a low noise amplifier (LNA); the noise figure (NF) and the gain may be optimized, since matching is narrower only for a given portion of the entire bandwidth (BW). Furthermore, the selectivity and rejection of the undesired jammers may be optimized and improved. As a consequence, the overall Rx/Tx isolation may be improved for free as a byproduct. This may be common for all cases.

Figure 10:
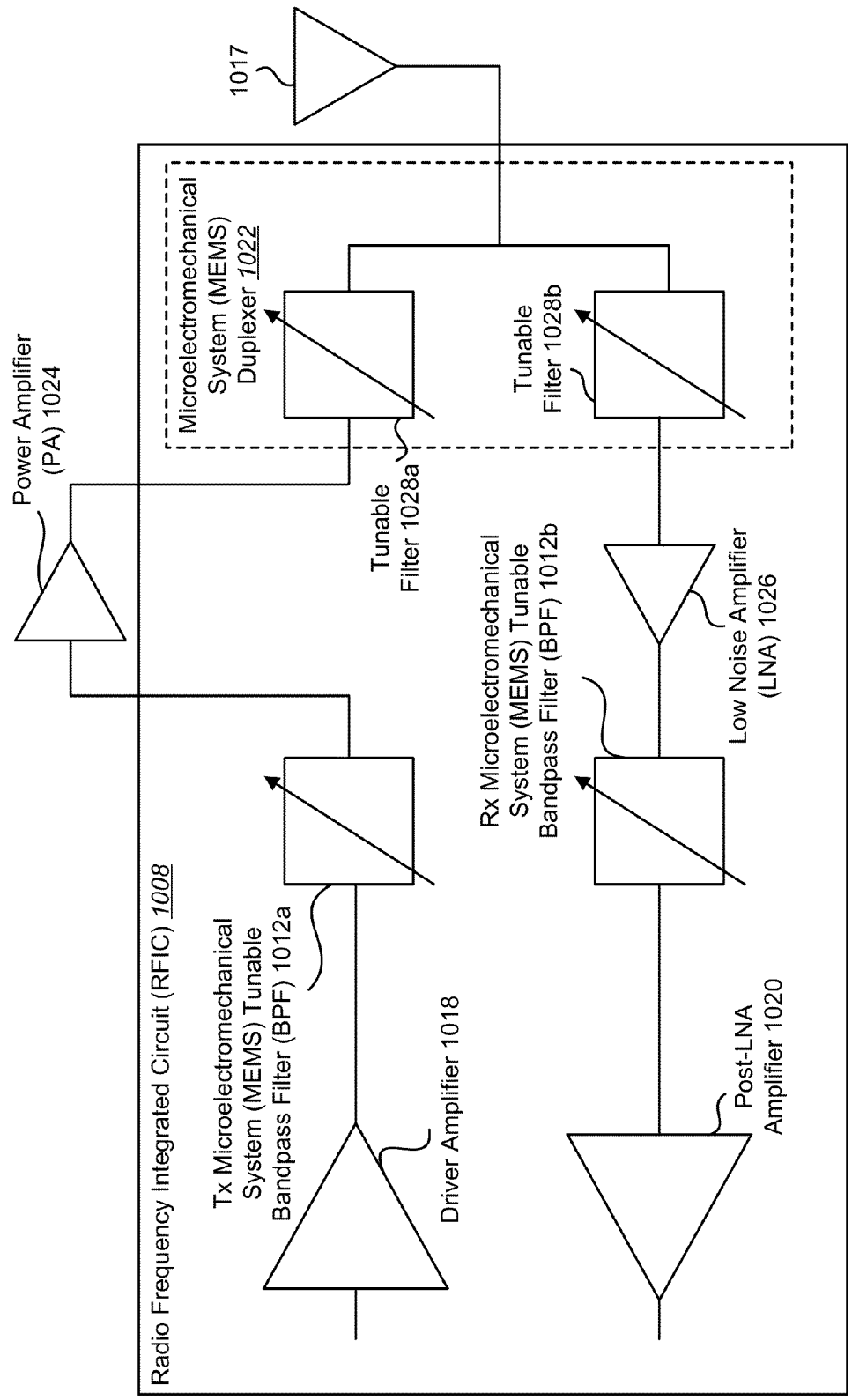
FIG. 10 is a block diagram illustrating another radio frequency integrated circuit (RFIC), where a portion of the front end module has been integrated into the radio frequency integrated circuit (RFIC)

FIG. 10 is a block diagram illustrating another radio frequency integrated circuit (RFIC) 1008, where a portion of the front end module 110 has been integrated into the radio frequency integrated circuit (RFIC) 1008. The front end module 110 may include a low noise amplifier (LNA) 1026 that is integrated on the radio frequency integrated circuit (RFIC) 1008 and a power amplifier (PA) 1024 that is not integrated on the radio frequency integrated circuit (RFIC) 1008. Integrating the low noise amplifier (LNA) 1026 on the radio frequency integrated circuit (RFIC) 1008 along with other portions of the front end module 110 may provide the gains discussed above while also reducing the number of off-chip components.

The front end module 110 may include a microelectromechanical system (MEMS) duplexer 1022 coupled to an antenna 1017. The microelectromechanical system (MEMS) duplexer 1022 may include a first tunable filter 1028a for the Tx chain and a second tunable filter 1028b for the Rx chain. Both the first tunable filter 1028a and the second tunable filter 1028b may use microelectromechanical system (MEMS) technology. The first tunable filter 1028a may be coupled to the output of the power amplifier (PA) 1024 that is not integrated with the radio frequency integrated circuit (RFIC) 1008. The power amplifier (PA) 1024 may be a low gain power amplifier (PA) 233 in a distributed gain power amplifier (PA) configuration 230. The input of the power amplifier (PA) 1024 may be coupled to a Tx microelectromechanical system (MEMS) bandpass filter (BPF) 1012a. The input of the Tx microelectromechanical system (MEMS) bandpass filter (BPF) 1012a may be coupled to the output of a driver amplifier 1018 on the radio frequency integrated circuit (RFIC) 1008.

The second tunable filter 1028b may be coupled to the input of the low noise amplifier (LNA) 1026 that is integrated with the radio frequency integrated circuit (RFIC) 1008. The low noise amplifier (LNA) 1026 may be low gain low noise amplifier (LNA) 341 in a distributed gain low noise amplifier (LNA) configuration 334. The output of the low noise amplifier (LNA) 1026 may be coupled to an Rx microelectromechanical system (MEMS) bandpass filter (BPF) 1012b. The output of the Rx microelectromechanical system (MEMS) bandpass filter (BPF) 1012b may be coupled to a post-LNA amplifier 1020 on the radio frequency integrated circuit (RFIC) 1008.

In another configuration (not shown), the power amplifier (PA) 1024 may be integrated on the radio frequency integrated circuit (RFIC) 1008 and the low noise amplifier (LNA) 1026 may not be integrated on the radio frequency integrated circuit (RFIC) 1008.

Figure 11:
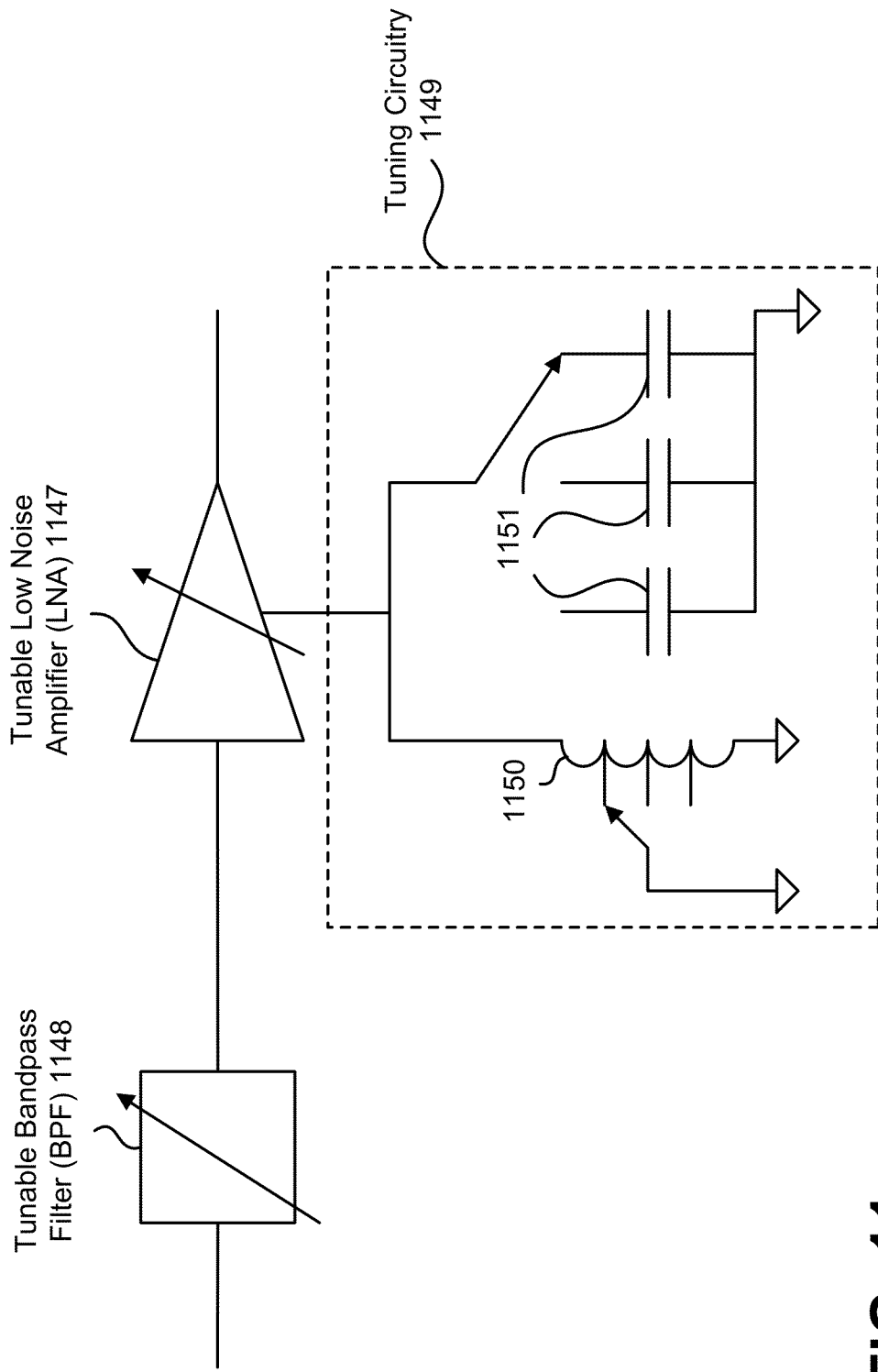
FIG. 11 is a circuit diagram illustrating a tunable low noise amplifier (LNA)

FIG. 11 is a circuit diagram illustrating a tunable low noise amplifier (LNA) 1147. The tunable low noise amplifier (LNA) 1147 may be a low noise amplifier (LNA) 341 or a post-LNA amplifier 339. In a tunable low noise amplifier (LNA) 1147, efficiency may be improved by optimizing gains into chunks of bands (like those depicted in FIG. 13, as an example). In other words, the bandwidth of the tunable low noise amplifier (LNA) 1147 may be narrowed to achieve higher gain, better power matching, better noise figure (NF) matching and a better voltage standing wave ratio (VSWR). The chunks of bands may be narrower and overlap. As a result, the narrower low noise amplifier (LNA) 1147 is easier to optimize for noise figure (NF), voltage standing wave ratio (VSWR), third order intercept point (IP3), the 1 dB compression measurement (P1 db) and power consumption is optimized. Moreover, this circuit concept improves receiver selectivity and rejection of undesired jammers and, as a byproduct, the Rx/Tx isolation is improved.

The tunable low noise amplifier (LNA) 1147 may be coupled to tuning circuitry 1149. The tuning circuitry 1149 (as an example for bandwidth (BW), gain and noise figure (NF) matching optimization) may include a switch coupling the tunable low noise amplifier (LNA) 1147 to ground via one of multiple capacitors 1151. The tuning circuitry 1149 may also include an adjustable inductor 1150 that is coupled between the tunable low noise amplifier (LNA) 1147 and ground. The tuning circuitry 1149 may also be implemented in various other ways.

In one configuration, a tunable bandpass filter (BPF) 1148 (also referred to as a "pre-selector") may be coupled to an input of the tunable low noise amplifier (LNA) 1147. The tunable bandpass filter (BPF) 1148 may also have a narrower bandwidth. The tunable bandpass filter (BPF) 1148 may reject the better of air blockers, which are undesired jamming signals called jammers or blockers, that are received at the antenna. These jammers are filtered and rejected by the radio frequency front end (RFFE) bandpass filter (such as the tunable bandpass filter (BPF) 1148) and further rejected by the tunable low noise amplifier (LNA) 1147, which is optimized to a narrower bandwidth (BW) as discussed above. In one configuration, the tunable bandpass filter (BPF) 1148 may perform Tx blocking as well as blocking Tx out-of-band noise while providing higher linearity and noise figure (NF).

Figure 12:
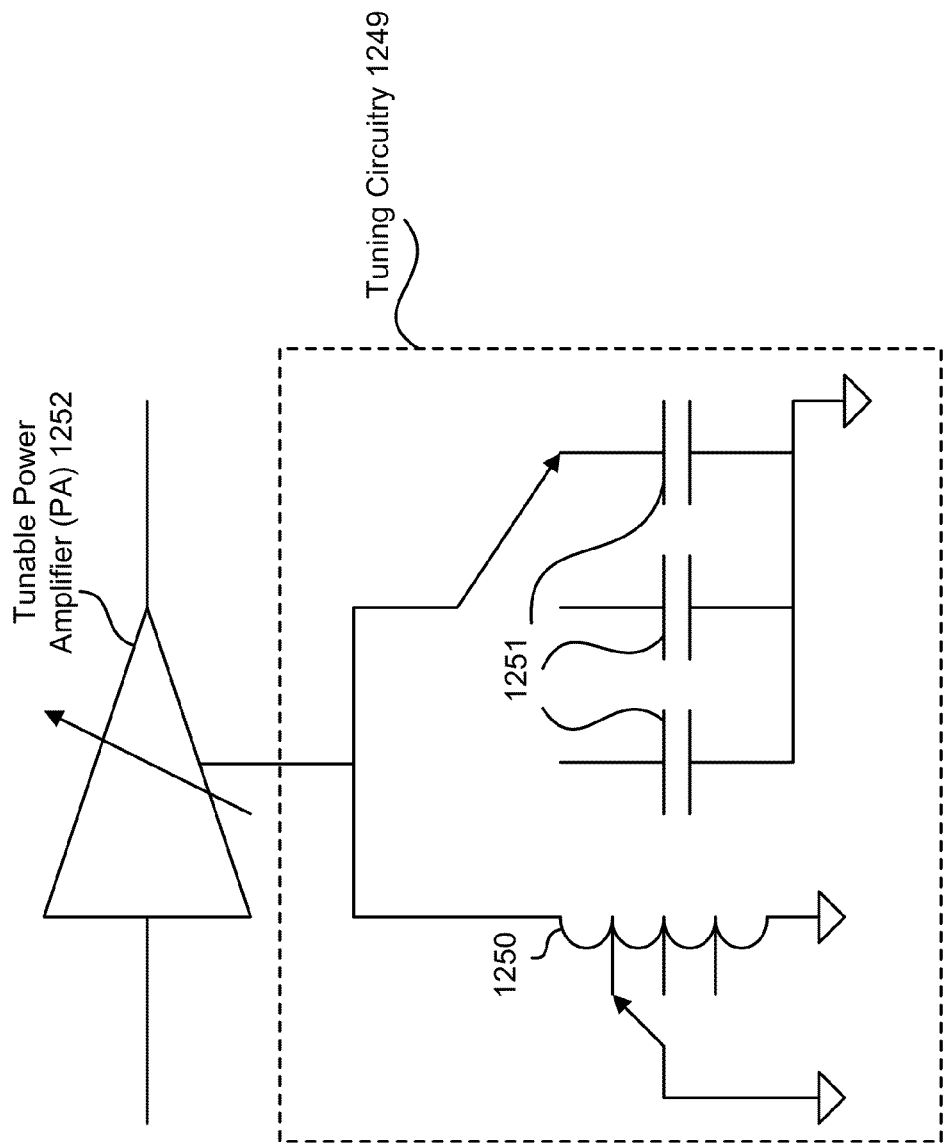
FIG. 12 is a circuit diagram illustrating a tunable power amplifier (PA)

FIG. 12 is a circuit diagram illustrating a tunable power amplifier (PA) 1252. The tunable power amplifier (PA) 1252 may be a Tx pre-amplifier (e.g., a Tx driver 231) or a power amplifier (PA) 233. In a tunable power amplifier (PA) 1252, the bandwidth of the tunable power amplifier (PA) 1252 may be divided into chunks of band that are narrower than the bandwidth and that overlap. A narrower power amplifier (PA) 1252 may be easier to optimize for power, gain, voltage standing wave ratio (VSWR), third order intercept point (IP3), 1 dB compression measurement (P1 db), power consumption and efficiency.

The tunable power amplifier (PA) 1252 may be coupled to tuning circuitry 1249. The tuning circuitry 1249 may include a switch coupling the tunable power amplifier (PA) 1252 to ground via one of multiple capacitors 1251. The tuning circuitry 1249 may also include an adjustable inductor 1250 that is coupled between the tunable power amplifier (PA) 1252 and ground. The tuning circuitry may also be implemented in various other ways.

In one configuration, a tunable bandpass filter (BPF) (not shown) may be coupled to an input of the tunable power amplifier (PA) 1252. In another configuration, a tunable bandpass filter (BPF) (not shown) may be coupled to an output of the tunable power amplifier (PA) 1252. A tunable power amplifier (PA) 1252 coupled with a tunable bandpass filter (BPF) may better reject Tx out-of-band noise while providing higher linearity efficiency.

Figure 13:
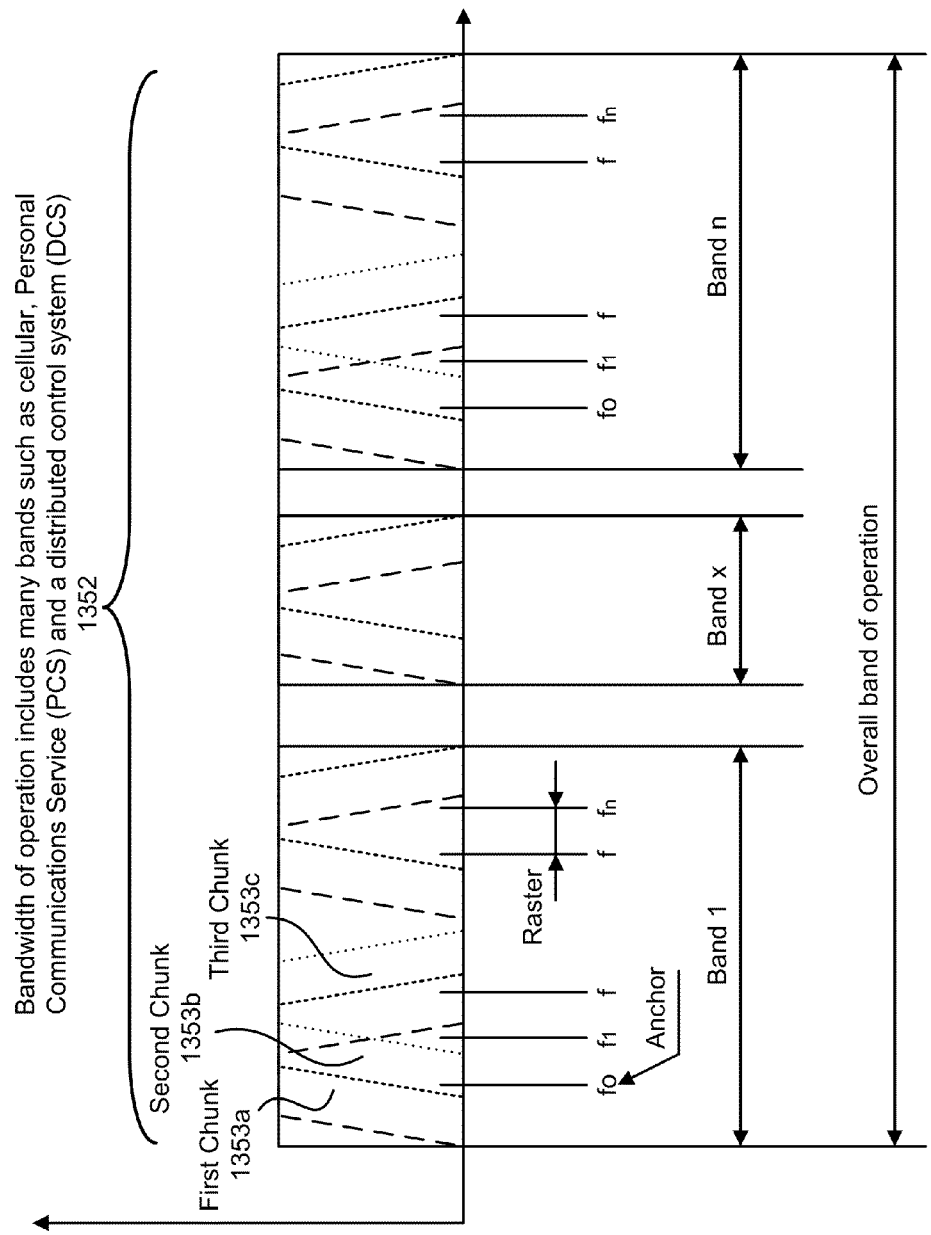
FIG. 13 is a graph illustrating bandwidth chunks selection and tuning.

FIG. 13 is a graph illustrating bandwidth chunks 1353a-c selection and tuning. A tunable front end module 110 and a tunable radio frequency integrated circuit (RFIC) front end may be realized in several tunability resolutions. The graph depicts either the transmit band or the receive band. The band 1352 shown is a wide band covering many bands of operation such as cellular, Personal Communications Service (PCS), distributed control system (DCS), etc. A tunable front end module 110 and a tunable radio frequency integrated circuit (RFIC) front end may operate using coarse tuning or fine tuning. The tunable front end module 110 may be an external block that is not part of the radio frequency integrated circuit (RFIC) 608. In contrast, a tunable radio frequency integrated circuit (RFIC) front end (such as the front end module 710) is a front end that is an integral part of the radio frequency integrated circuit (RFIC) 708. The Rx filter 712b, low noise amplifier (LNA) 726) and in some cases the tunable filter 728b may be internal to the radio frequency integrated circuit (RFIC) 708 with an Rx antenna and a separate Tx antenna; thus the Rx has a full radio frequency front end (RFFE) in the radio frequency integrated circuit (RFIC) 708.

In such cases, the radio frequency integrated circuit (RFIC) 708 may include, on the Tx path, the Tx microelectromechanical system (MEMS) tunable bandpass filter (BPF) 712a and, on the Rx side, the Rx microelectromechanical system (MEMS) tunable bandpass filter (BPF) 712b and the low noise amplifier (LNA) 726, only in order to prevent noise leakage to the receive chain from the input of the tunable filter 728b. The radio frequency integrated circuit (RFIC) 708 may also include Rx microelectromechanical system (MEMS) tunable bandpass filter (BPF) when the antenna 717 is an Rx only antenna. When the antenna 717 is common to both Tx and Rx and when the tunable filter 728b is included within the radio frequency integrated circuit (RFIC) 708, Tx noise may leak into the Rx signal. This is applicable even though additional power arrangements are required within the radio frequency integrated circuit (RFIC) 708 to enable Tx power. Alternatively, the entire front end module 710 may be included on the radio frequency integrated circuit (RFIC) 708 while the power amplifier (PA) 724 is external to isolate the power amplifier (PA) 724 Tx noise and current hits in time division multiple access (TDMA). Other variants may also be applicable.

The microelectromechanical system (MEMS) topology presented herein can be further expanded for Long Term Evolution (LTE) multiple-input and multiple-output (MIMO) and carrier aggregation. For example, in a specific small frequency Rx/Tx duplexer, there is no need to split the radio frequency front end (RFFE) filters, as the narrower microelectromechanical system (MEMS) filter at the front end operates as a pre-selector. For cases of carrier aggregation (Long Term Evolution (LTE) inter and intra carrier aggregation), the tenability saves the need of multiple bulk acoustic wave (BAW)/surface acoustic wave (SAW) filters and the tuning of the microelectromechanical system (MEMS) filter according to the band chunk 1353 is available from the entire band chunk 1353 grid.

In coarse tuning, the tunable components (e.g., the Rx microelectromechanical system (MEMS) tunable bandpass filter (BPF) 412b, the Tx microelectromechanical system (MEMS) tunable bandpass filter (BPF) 412a, the first tunable filter 428a, the second tunable filter 428b, the tunable power amplifier (PA) 1252, the tunable driver amplifier 418, the tunable low noise amplifier (LNA) 1147 and the tunable post-LNA amplifier 420) may be tuned to the desired band of operation. The center frequency of the tuning may be the center frequency of the Rx band for the Rx chain and the center frequency of the Tx band for the Tx chain.

To achieve higher selectivity for the Rx and use the front end as a pre-selector and to optimize the Tx for higher gain over a narrower bandwidth, the Rx and Tx bands in a given standard are divided into chunks 1353 of narrower bands that overlap. Each chunk 1353 has a center frequency f0, f1, etc. The lowest bandwidth chunk 1353 center frequency f0 is marked as the anchor point from where tuning and band selection starts. The step between two bandwidth chunks 1353 is the raster of the tuning. If the tuning is too fine (i.e., the chunks 1353 are too narrow), high loss may be created in the filters. Thus, the bandwidth of a chunk 1353 and the number of chunks 1353 may be optimized for each standard. The Rx and Tx anchor frequency of the first bandwidth chunk 1353*a* may have the same duplex separation as defined by the standard of activity (e.g., cellular 45 megahertz (MHz), Personal Communications System (PCS) 80 MHz, distributed control system (DCS) 95 MHz).

Figure 14:
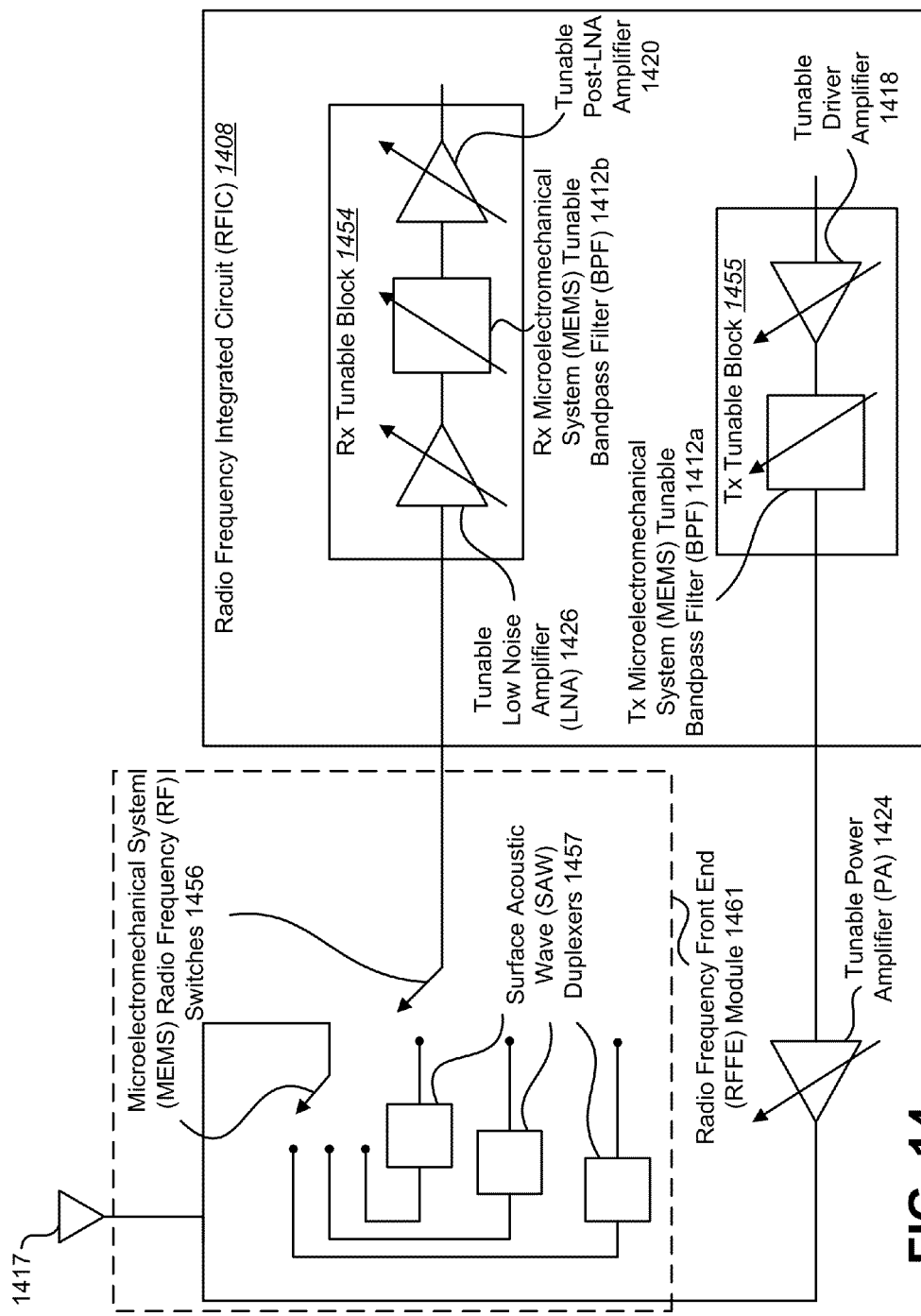
FIG. 14 is a block diagram illustrating a radio frequency integrated circuit (RFIC) with a fully integrated front end module.

FIG. 14 is a block diagram illustrating a radio frequency integrated circuit (RFIC) 1408 with a fully integrated front end module 110. In the radio frequency integrated circuit (RFIC) 1408, microelectromechanical system (MEMS) tunability with gain and filtering distribution is partially implemented as an Rx tunable block 1454. The Rx tunable block 1454 may include a tunable low noise amplifier (LNA) 1426, an Rx microelectromechanical system (MEMS) tunable bandpass filter (BPF) 1412*b* and a tunable post-LNA 1420 integrated on the radio frequency integrated circuit (RFIC) 1408. The Rx input may be routed by a microelectromechanical system (MEMS) RF switch 1456 with very low insertion loss. The microelectromechanical system (MEMS) RF switch 1456 may couple the Rx tunable block 1454 to an antenna 1417 via different Rx surface acoustic wave (SAW) duplexers 1457 for the Rx path. The Rx surface acoustic wave (SAW) duplexers 1457 may have relaxed specification requirements, since the Rx tunable block 1454 is tuned to an optimized bandwidth. In one configuration, the microelectromechanical system (MEMS) radio frequency (RF) switch 1456 and the surface acoustic wave (SAW) duplexers 1457 may be part of a radio frequency front end (RFFE) module 1461 that is located off the radio frequency integrated circuit (RFIC) 1408. Because the radio frequency front end (RFFE) module 1461 is external to the radio frequency integrated circuit (RFIC) 1408, the pin count of the radio frequency integrated circuit (RFIC) 1408 may be maintained. In one configuration, the surface acoustic wave (SAW) duplexers 1457 may be bulk acoustic wave (BAW) filters.

The Tx path may include a tunable power amplifier (PA) 1424, a Tx microelectromechanical system (MEMS) tunable bandpass filter (BPF) 1412*a* and a tunable driver amplifier 1418. The Tx microelectromechanical system (MEMS) tunable bandpass filter (BPF) 1412*a* and the tunable driver amplifier 1418 may be part of a Tx tunable block 1455. The tunable power amplifier (PA) 1424 may be implemented externally to the radio frequency integrated circuit (RFIC) 1408 to prevent undesired effects on the receive path and the local oscillator (LO), such as current hits that may create pushing effects on the voltage controlled oscillator (VCO) and voltage standing wave ratio (VSWR) pulling of the voltage controlled oscillator (VCO). The tunable power amplifier (PA) 1424 may also be external to the radio frequency integrated circuit (RFIC) 1408 to avoid desensitization of the Rx path.

Since the power amplifier (PA) 1424 is tunable with bandwidth (BW) optimization, it is a narrow bandwidth (BW) amplifier that emits less than a conventional power amplifier (PA). As a result, the output filter can be saved and excessive loss between the power amplifier (PA) and the antenna may be saved. Therefore, the Tx power efficiency is improved, which directly improves talk time (and other features).

Figure 14A:
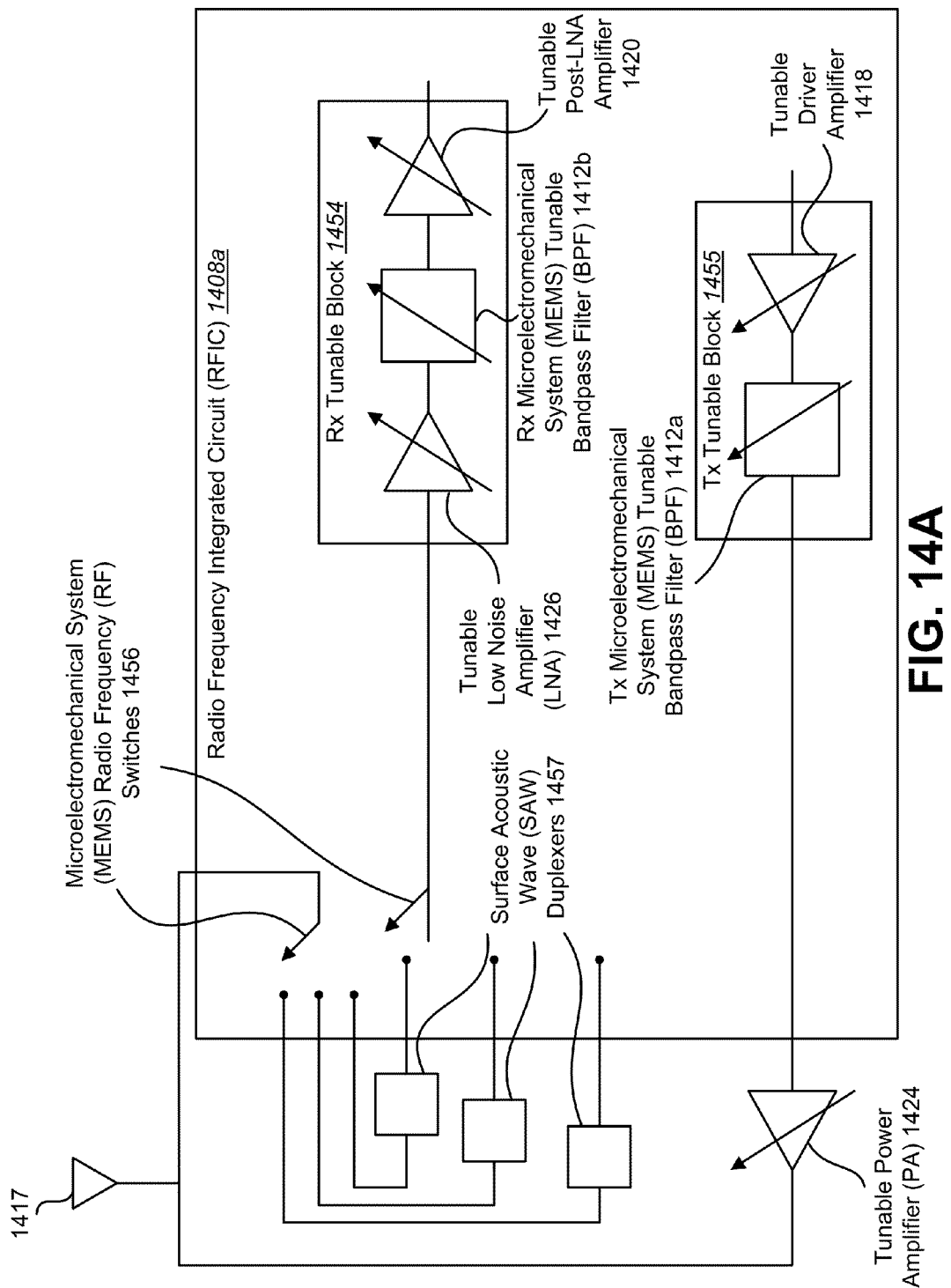
FIG. 14A is a block diagram illustrating a radio frequency integrated circuit (RFIC) where the microelectromechanical system (MEMS) radio frequency (RF) switches have been integrated with the radio frequency integrated circuit (RFIC)

FIG. 14A is a block diagram illustrating a radio frequency integrated circuit (RFIC) 1408*a* where the microelectromechanical system (MEMS) radio frequency (RF) switches 1456 have been integrated with the radio frequency integrated circuit (RFIC) 1408*a*. The radio frequency integrated circuit (RFIC) 1408*a* of FIG. 14A may include similar components as the radio frequency integrated circuit (RFIC) 1408 of FIG. 14. However, the microelectromechanical system (MEMS) switches 1456 have been integrated with the radio frequency integrated circuit (RFIC) 1408*a*. The radio frequency integrated circuit (RFIC) 1408*a* may reduce losses in the radio frequency integrated circuit (RFIC) 1408 because no printed circuit board (PCB) soldering is needed; however, additional pins may be required.

Figure 15:
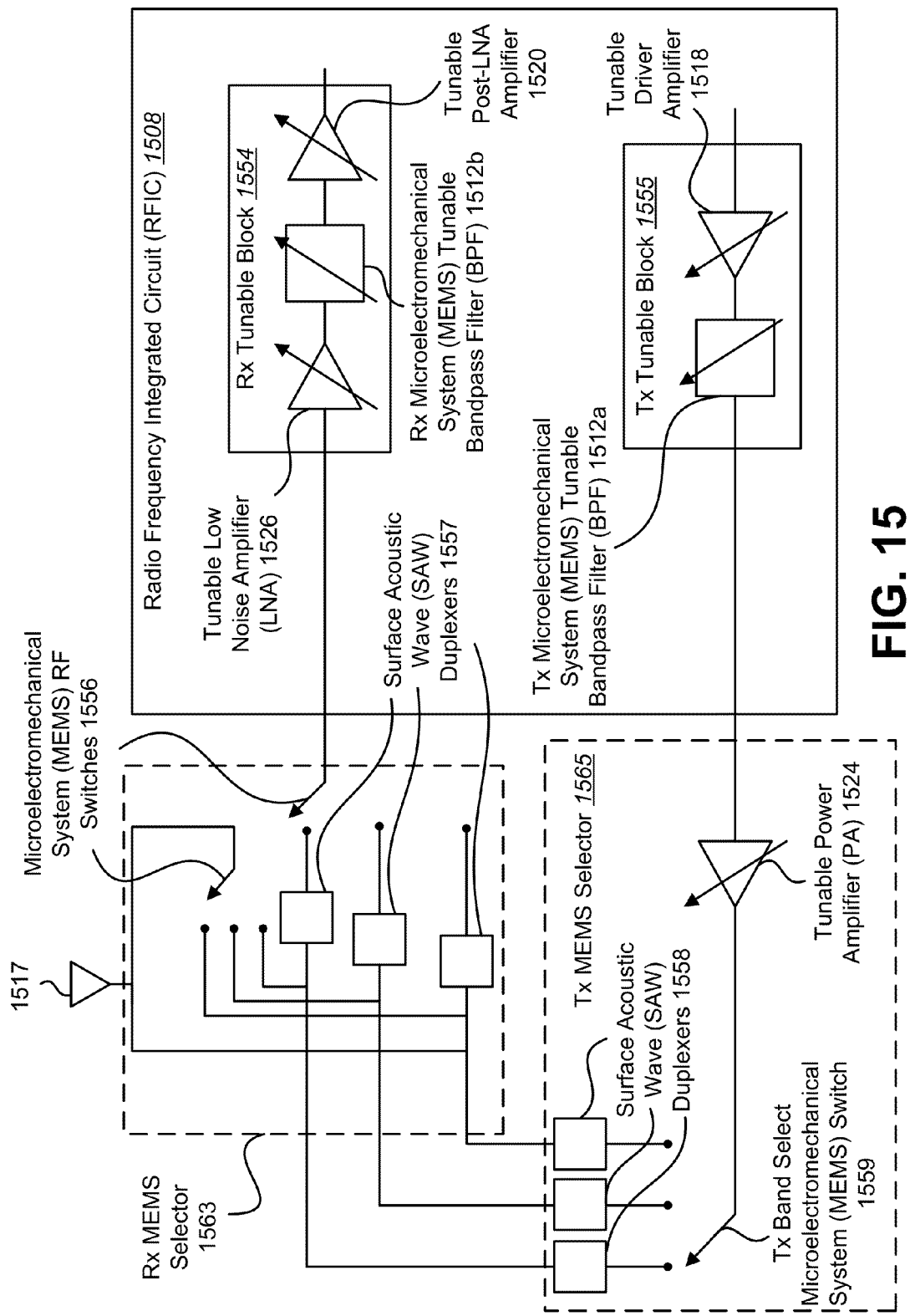
FIG. 15 is a block diagram illustrating another radio frequency integrated circuit (RFIC) with a fully integrated front end module.

FIG. 15 is a block diagram illustrating another radio frequency integrated circuit (RFIC) 1508 with a fully integrated front end module 110. In the radio frequency integrated circuit (RFIC) 1508, microelectromechanical system (MEMS) tunability with gain and filtering distribution is partially implemented as an Rx tunable block 1554. The Rx tunable block 1554 may include a tunable low noise amplifier (LNA) 1526, an Rx microelectromechanical system (MEMS) tunable bandpass filter (BPF) 1512*b* and a tunable post-LNA amplifier 1520 integrated on the radio frequency integrated circuit (RFIC) 1508. The Rx input may be routed by a microelectromechanical system (MEMS) RF switch 1556 with very low insertion loss. The microelectromechanical system (MEMS) RF switch 1556 may couple the Rx tunable block 1554 to an antenna 1517 via different Rx surface acoustic wave (SAW) duplexers 1557 for the Rx path. The Rx surface acoustic wave (SAW) duplexers 1557 may have relaxed specification requirements, since the Rx tunable block 1554 is tuned to an optimized bandwidth. The microelectromechanical system (MEMS) RF switch 1556 and the surface acoustic wave (SAW) duplexers 1557 may be part of a Rx module with MEMS selector 1563 (i.e., a first front end module (FEM)).

The Tx path may include a tunable power amplifier (PA) 1524, a Tx microelectromechanical system (MEMS) tunable bandpass filter (BPF) 1512*a* and a tunable driver amplifier 1518. The tunable power amplifier (PA) 1524 may be part of a first front end module (FEM) that is off chip. The Tx microelectromechanical system (MEMS) tunable bandpass filter (BPF) 1512*a* and the tunable driver amplifier 1518 may be part of a Tx tunable block 1555 within the radio frequency integrated circuit (RFIC) 1508. The tunable power amplifier (PA) 1524 may be implemented external to the radio frequency integrated circuit (RFIC) 1508 to prevent undesired effects on the Rx path and the local oscillator (LO) such as current hits that may create pushing effects on the voltage controlled oscillator (VCO) and voltage standing wave ratio (VSWR) pulling of the voltage controlled oscillator (VCO). The tunable power amplifier (PA) 1524 may also be external to the radio frequency integrated circuit (RFIC) 1508 to avoid desensitization of the Rx path.

A Tx band select microelectromechanical system (MEMS) switch 1559 with very low insertion loss (IL) and high linearity may be used between the tunable power amplifier (PA) 1524 and different Tx surface acoustic wave (SAW) duplexers 1558. The Tx band select microelectromechanical system (MEMS) switch 1559, the tunable power amplifier (PA) 1524 and the surface acoustic wave (SAW) duplexers 1558 may be part of a Tx module with MEMS selector 1565 (i.e., a second front end module (FEM)) that is located external to the radio frequency integrated circuit (RFIC) 1508. Each port of the Tx band select microelectromechanical system (MEMS) switch

1559 may route the tunable power amplifier (PA) 1524 to the appropriate Tx port of a Tx surface acoustic wave (SAW) duplexer 1558 for the Tx path. The common port of the Tx surface acoustic wave (SAW) duplexer 1558 may be routed to the antenna 1517.

The complexity of the tunable power amplifier (PA) 1524 may be reduced due to the usage of the Tx microelectromechanical system (MEMS) bandpass filter (BPF) 1512*a* in the Tx tunable block 1555 within the radio frequency integrated circuit (RFIC) 1508 with compromising Tx filter insertion loss (IL). The specifications of the Tx surface acoustic wave (SAW) duplexers 1558 and the Rx surface acoustic wave (SAW) duplexers 1557 may be reduced because the bandwidth operation is divided into several sub-bands, where each sub-band includes several consecutive chunks 1353. Thus, both the Rx insertion loss (IL) of the Rx surface acoustic wave (SAW) duplexers 1557 and the Tx insertion loss (IL) of the Tx surface acoustic wave (SAW) duplexers 1558 may be improved as the specification is relaxed on the front end filtration. This is because the tunable microelectromechanical system (MEMS) filter 1554 in the Rx tunable block 1554 and the Tx tunable block 1555 provide the selectivity and attenuation, as their bandwidth is narrower and is tuned each time to the desired chunk 1353. Both the Tx band select microelectromechanical system (MEMS) switch 1559 and the microelectromechanical system (MEMS) RF switch 1556 may be part of a second front end module (FEM) that is off chip.

A tunable network to the antenna 1517 may be utilized to improve and optimize the Rx/Tx voltage standing wave ratio (VSWR), thereby further improving the Tx performance in aspects of power efficiency and Rx noise figure (NF) as well as the Rx selectivity and further reducing the Tx desensitization noise.

Figure 15A:
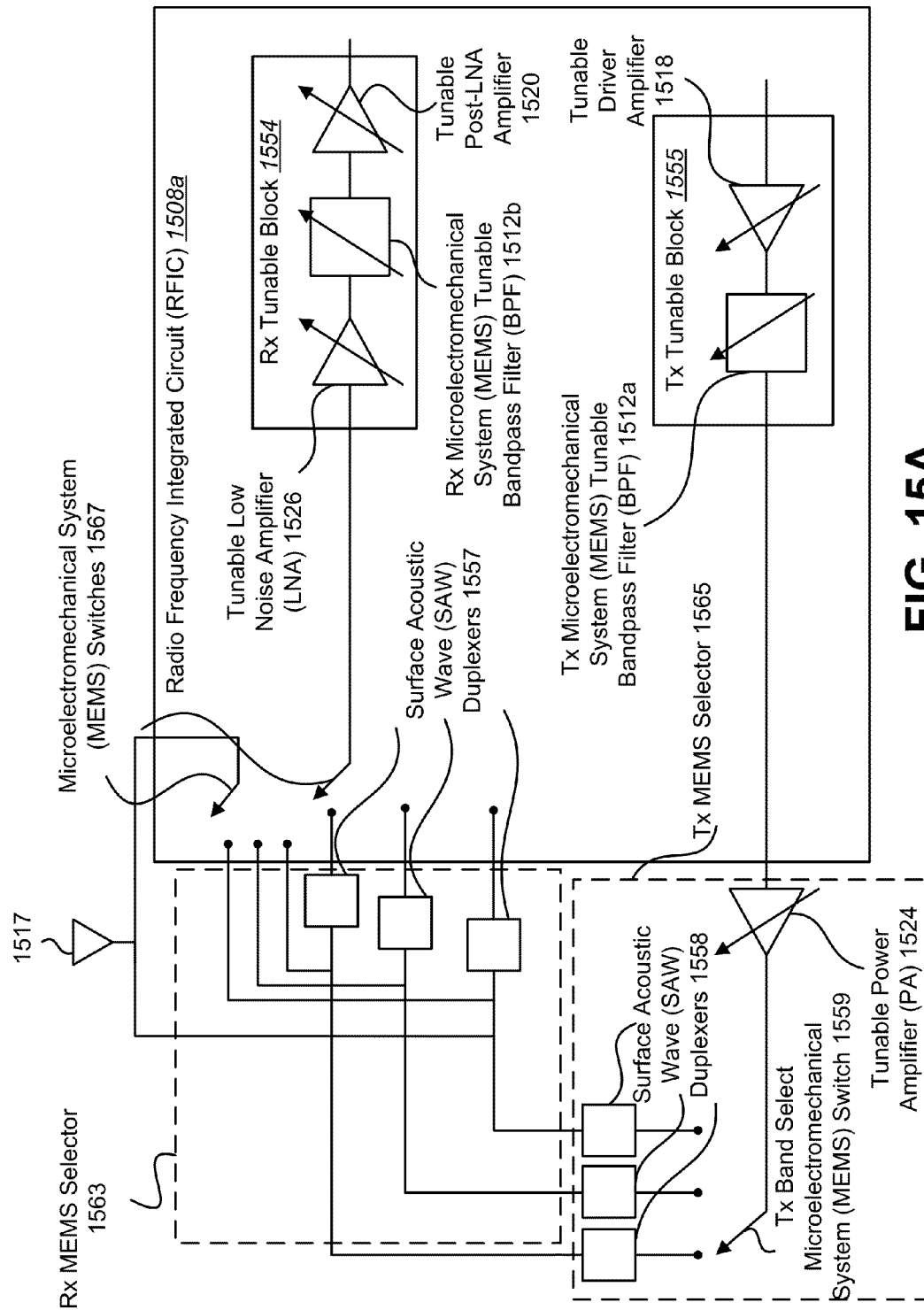
FIG. 15A is a block diagram illustrating the radio frequency integrated circuit (RFIC) where the microelectromechanical system (MEMS) switches are integrated within the radio frequency integrated circuit (RFIC)

The Tx front end module (FEM), which includes the MEMS selector 1565, and the Rx front end module (FEM), which includes the Rx MEMS selector 1563, may be merged to a single front end module (FEM) (as illustrated in FIG. 15A). In this case, the microelectromechanical system (MEMS) switches 1567 are within the radio frequency integrated circuit (RFIC) 1508 (as opposed to the microelectromechanical system (MEMS) switches 1556 that are not in the radio frequency integrated circuit (RFIC) 1508). This saves insertion loss and further improves sensitivity and power saves, at the expense of increasing the radio frequency integrated circuit (RFIC) 1508 pin count. The power amplifier (PA) 1524 is tunable, since a tunable power amplifier (PA) 1524 with a bandpass filter (BPF) characteristic increases the immunity of the Rx path against Tx noise. Because the low noise amplifier (LNA) 1526 is also tunable with bandpass filter (BPF) characteristics, further rejection may be obtained. The solution illustrated in FIG. 15 is full duplex that utilizes tunable microelectromechanical system (MEMS) filters (with surface acoustic wave (SAW) or band acoustic wave (BAW) filters in the front end module (FEM)). The front end module (FEM) may also include surface acoustic wave (SAW) microelectromechanical system (MEMS) filters as well. Thus, the solution illustrated in FIG. 15 is particularly useful for LTE where duplex separation requirements are more stringent.

FIG. 15A is a block diagram illustrating the radio frequency integrated circuit (RFIC) 1508*a* where the microelectromechanical system (MEMS) switches are integrated within the radio frequency integrated circuit (RFIC) 1508*a*. The radio frequency integrated circuit (RFIC) 1508*a* of FIG. 15A may include similar components as the radio frequency integrated circuit (RFIC) 1508 of FIG. 15. However, the microelectromechanical system (MEMS) switches 1567 have been integrated within the radio frequency integrated circuit (RFIC) 1508*a*. The radio frequency integrated circuit (RFIC) 1508*a* may reduce losses in the radio frequency integrated circuit (RFIC) 1508 at the expense of pin count.

Figure 16:
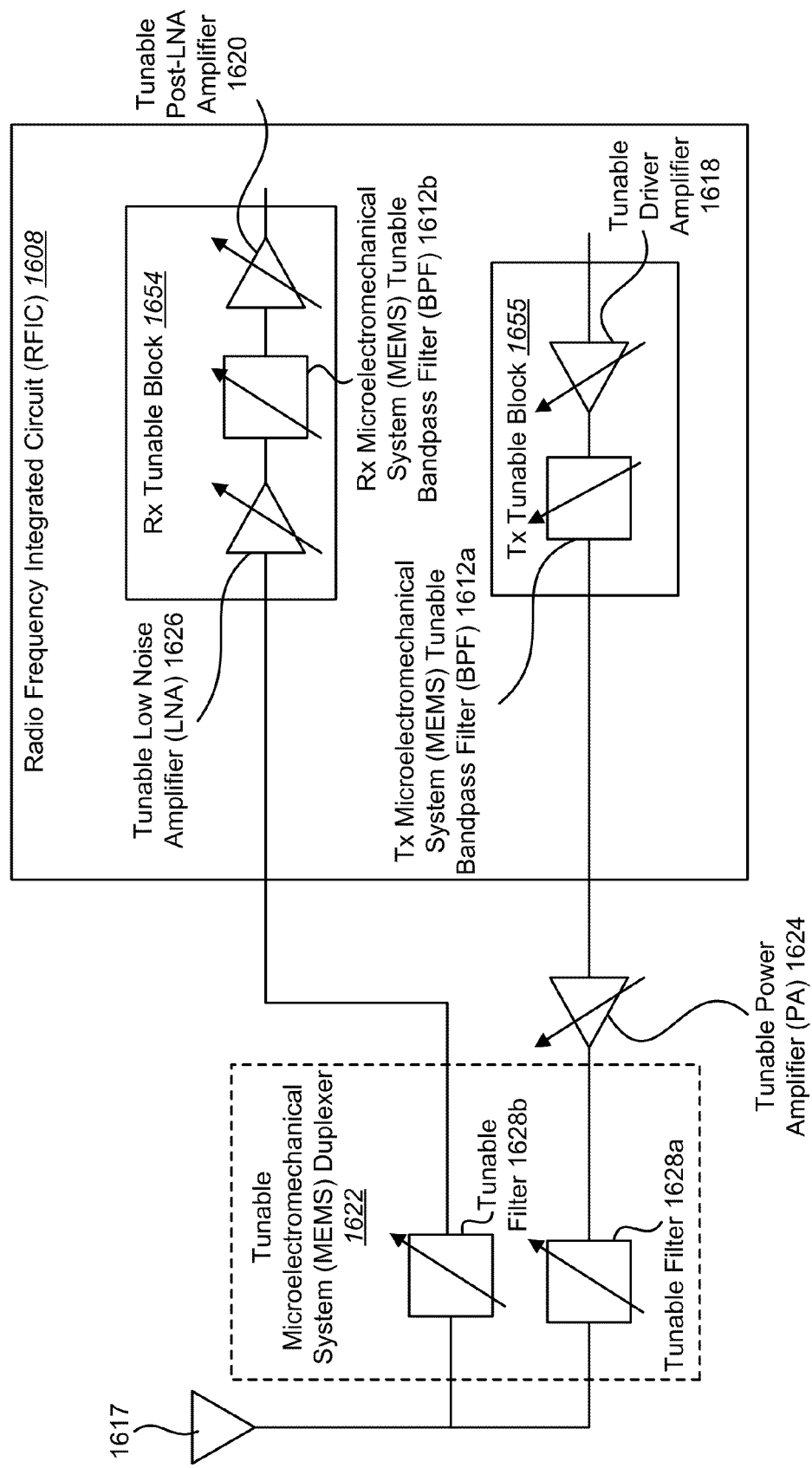
FIG. 16 is a block diagram illustrating yet another radio frequency integrated circuit (RFIC) with an integrated front end module.

FIG. 16 is a block diagram illustrating yet another radio frequency integrated circuit (RFIC) 1608 with an integrated front end module 110. In the radio frequency integrated circuit (RFIC) 1608, microelectromechanical system (MEMS) tunability with gain and filtering distribution is partially implemented as an Rx tunable block 1654 within the radio frequency integrated circuit (RFIC) 1608. The Rx tunable block 1654 may include a tunable low noise amplifier (LNA) 1626, an Rx microelectromechanical system (MEMS) tunable bandpass filter (BPF) 1612*b* and a post-LNA amplifier 1620 that are implemented within the radio frequency integrated circuit (RFIC) 1608. The Rx input may be routed to an external tunable microelectromechanical system (MEMS) duplexer 1622 that includes a first tunable filter 1628*a* for the Rx and a second tunable filter 1628*b* for the Tx. Both the first tunable filter 1628*a* and the second tunable filter 1628*b* may use microelectromechanical system (MEMS) technology. The tunable microelectromechanical (MEMS) duplexer 1622 may be coupled to the antenna 1617.

The Tx path may include a tunable power amplifier (PA) 1624 with bandpass filter (BPF) characteristics, a Tx microelectromechanical system (MEMS) tunable bandpass filter (BPF) 1612*a* and a tunable driver amplifier 1618. The Tx microelectromechanical system (MEMS) tunable bandpass filter (BPF) 1612*a* and the tunable driver amplifier 1618 may be part of a Tx tunable block 1655 within the radio frequency integrated circuit (RFIC) 1608. The tunable power amplifier (PA) 1624 may be implemented external to the radio frequency integrated circuit (RFIC) 1608 to prevent undesired effects on the Rx path and the local oscillator (LO) such as current hits that may create pushing effects on the voltage controlled oscillator (VCO) and voltage standing wave ratio (VSWR) pulling of the voltage controlled oscillator (VCO). The tunable power amplifier (PA) 1624 may also be external to the radio frequency integrated circuit (RFIC) 1608 to avoid desensitization of the Rx path. Because the tunable driver amplifier 1618 and the Tx microelectromechanical system (MEMS) tunable bandpass filter (BPF) 1612*a* operate with the tunable power amplifier (PA) 1624, better rejection of wideband Tx noise leakage may be obtained while optimizing Tx matching to the load and gain optimization. This may result in higher efficiency, lower power consumption and lower desensitization of the receiver. The tunable power amplifier (PA) 1624 may be coupled to the first tunable filter 1628*a* within the tunable duplexer 1622. The first tunable filter 1628*a* may also be coupled to the antenna 1617 at the common port of the duplexer 1622.

Band selection may be accomplished by the tunability of the filters and amplifiers. Since the filters and amplifiers are tunable, further selectivity and gain optimization may be obtained. The Rx path filtration may reduce the Tx noise such that the second tunable filter 1628*b* for Rx in the tunable microelectromechanical system (MEMS) duplexer 1622 can have relaxed specifications with higher selectivity compared to an ordinary surface acoustic wave (SAW) filter. Furthermore, the use of a tunable microelectromechanical system (MEMS) duplexer 1622 in place of multiple surface acoustic wave (SAW) duplexers further reduces the number of off-chip components.

Figure 17:
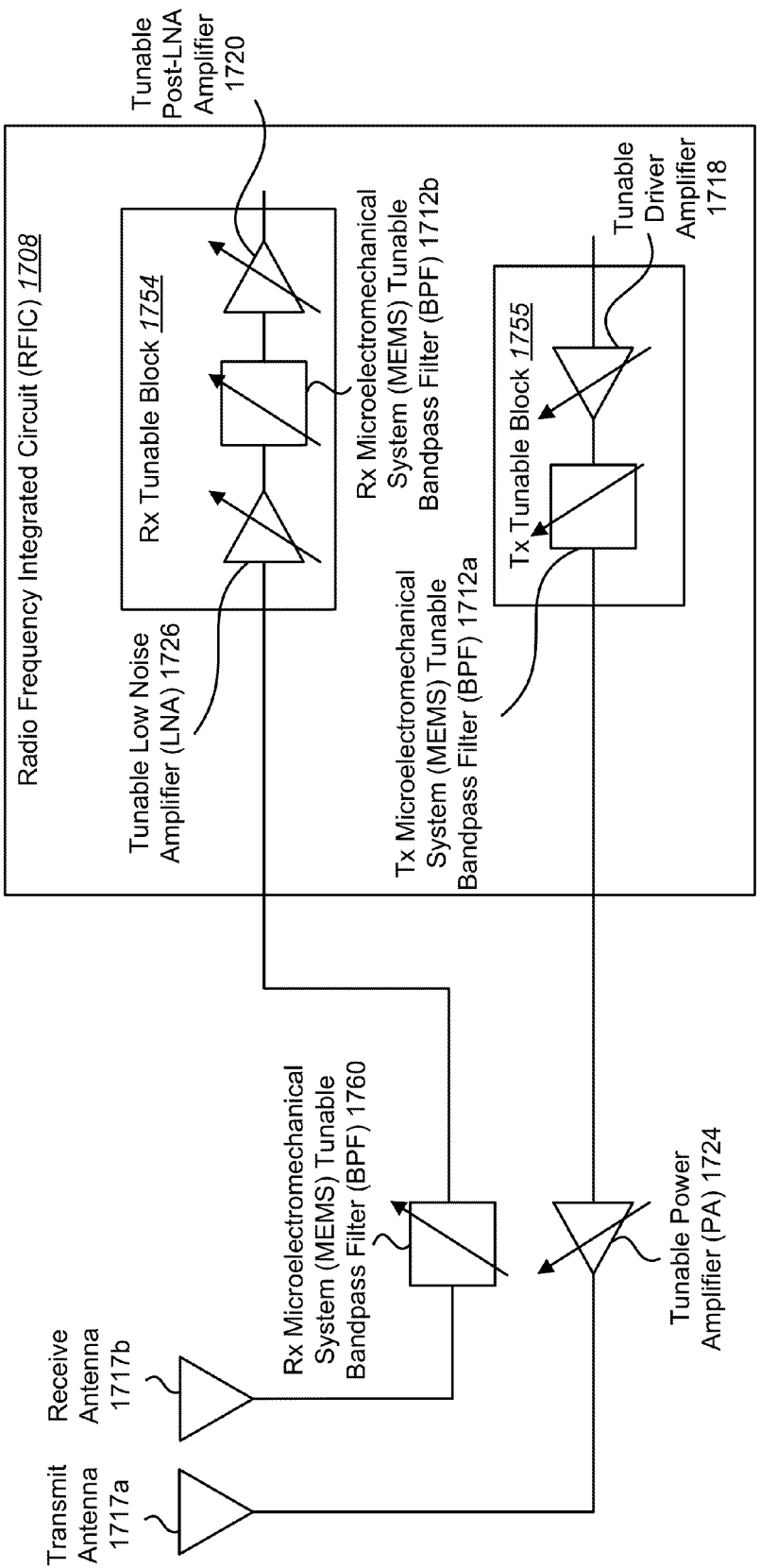
FIG. 17 is a block diagram illustrating a radio frequency integrated circuit (RFIC) with an integrated front end module that does not include a duplexer.

FIG. 17 is a block diagram illustrating a radio frequency integrated circuit (RFIC) 1708 with an integrated front end module 110 that does not include a duplexer. In the radio frequency integrated circuit (RFIC) 1708, microelectromechanical system (MEMS) tunability with gain and filtering distribution is partially implemented as an Rx tunable block 1754. The Rx tunable block 1754 may include a tunable low noise amplifier (LNA) 1726, an Rx microelectromechanical system (MEMS) tunable bandpass filter (BPF) 1712*b* and a tunable post-LNA amplifier 1720 that are integrated within the radio frequency integrated circuit (RFIC) 1708. The Rx input may be routed to the Rx antenna 1717*b* via an Rx microelectromechanical system (MEMS) bandpass filter (BPF) 1760.

The Tx path may include a tunable power amplifier (PA) 1724, a Tx microelectromechanical system (MEMS) tunable bandpass filter (BPF) 1712*a* and a tunable driver amplifier 1718. The Tx microelectromechanical system (MEMS) tunable bandpass filter (BPF) 1712*a* and the tunable driver amplifier 1718 may be part of a Tx tunable module 1755 within the radio frequency integrated circuit (RFIC) 1708. The tunable power amplifier (PA) 1724 may be implemented external to the radio frequency integrated circuit (RFIC) 1708 to prevent undesired effects on the Rx path and the local oscillator (LO) such as current hits that may create pushing effects on the voltage controlled oscillator (VCO) and voltage standing wave ratio (VSWR) pulling of the voltage controlled oscillator (VCO). The tunable power amplifier (PA) 1724 may also be external to the radio frequency integrated circuit (RFIC) 1708 to avoid desensitization of the Rx path.

Because the tunable driver amplifier 1718 and the Tx microelectromechanical system (MEMS) tunable bandpass filter (BPF) 1712*a* operate with the tunable power amplifier (PA) 1724, better rejection of wideband Tx noise leakage may be obtained while optimizing Tx matching to the load and gain optimization. This may result in higher efficiency, lower power consumption and lower desensitization of the receiver. The Rx tunable block 1754 may be coupled to a receive antenna 1717*b* via an Rx microelectromechanical system (MEMS) tunable bandpass filter (BPF) 1760.

The tunable power amplifier (PA) 1724 may be coupled directly to the transmit antenna 1717*a* without a tunable filter. Because the tunable power amplifier (PA) 1724 has a narrower bandwidth that covers the entire bandwidth of operation in chunks 1353, the tunable filter is not required. In other words, the tunable power amplifier (PA) 1724 may operate as an RF front end bandpass filter (BPF). As a consequence, the insertion loss (IL) between the tunable power amplifier (PA) 1724 and the transmit antenna 1717*a* is lowered. This may improve the efficiency of the tunable power amplifier (PA) 1724, since no back-off gain is needed to compensate for excessive insertion loss (IL).

The connection of the tunable power amplifier (PA) 1724 directly to the transmit antenna 1717*a* may improve the Tx power saving and efficiency. Tx out-of-band wideband noise and harmonics may be reduced by design, since the tunable power amplifier (PA) 1724 is a tunable narrow band power amplifier (PA) that covers the entire bandwidth of operation. The direct connection of the tunable power amplifier (PA) 1724 to a dedicated transmit antenna 1717*a* and the use of a tunable matching network may reduce the mismatch-loss and thus, further Tx power efficiency is gained.

The Rx path may be protected against Tx noise in several ways. For example, the Rx path uses a different receive antenna 1717*b* than the Tx path, hence there is an inherent Rx/Tx isolation between the receive antenna 1717*b* and the transmit antenna 1717*a*. This is critical in current Long Term Evolution (LTE) designs and new releases. Furthermore, the tunability of the Rx path protects against Tx blocking. Because the Rx tunable block 1754 within the radio frequency integrated circuit (RFIC) 1708 is tunable, the Rx tunable block 1754 operates as a pre-selector, thereby protecting the Rx path from compression and Tx noise. Because the Rx path uses a separate receive antenna 1717*b*, the insertion loss (IL) is reduced (because a duplexer is not used). By reducing the insertion loss (IL), the noise figure (NF) is improved (as demonstrated in the first term and the second term of Equation (6) above).

Moreover, because the transmit path and the receive path each have their own antenna 1717*a-b*, better antenna matching may be accomplished. Hence, a better noise figure (NF) in the receive path and better power matching at the transmit path may be obtained. Since matching is tunable in chunks 1353, a narrow band matching is that is superior over wideband matching is achieved. Narrow band matching has a band pass filter (BPF) characteristic that adds additional Rx/Tx isolation and selectivity.

An additional implementation of FIG. 17 is to use only a single antenna. In this case, the output of the tunable power amplifier (PA) 1724 may be coupled to an Rx/Tx antenna that is shared by the input of the Rx microelectromechanical system (MEMS) tunable bandpass filter (BPF) 1760. As discussed above, the isolation between the receive (Rx) and the transmit (Tx) may be accomplished due to the narrow band characteristics of the tunable power amplifier (PA) 1724 and the Rx microelectromechanical system (MEMS) tunable bandpass filter (BPF) 1760. Both the tunable power amplifier (PA) 1724 and the Rx microelectromechanical system (MEMS) tunable bandpass filter (BPF) 1760 have a band pass characteristic that is tuned in chunks 1353.

Figure 18:
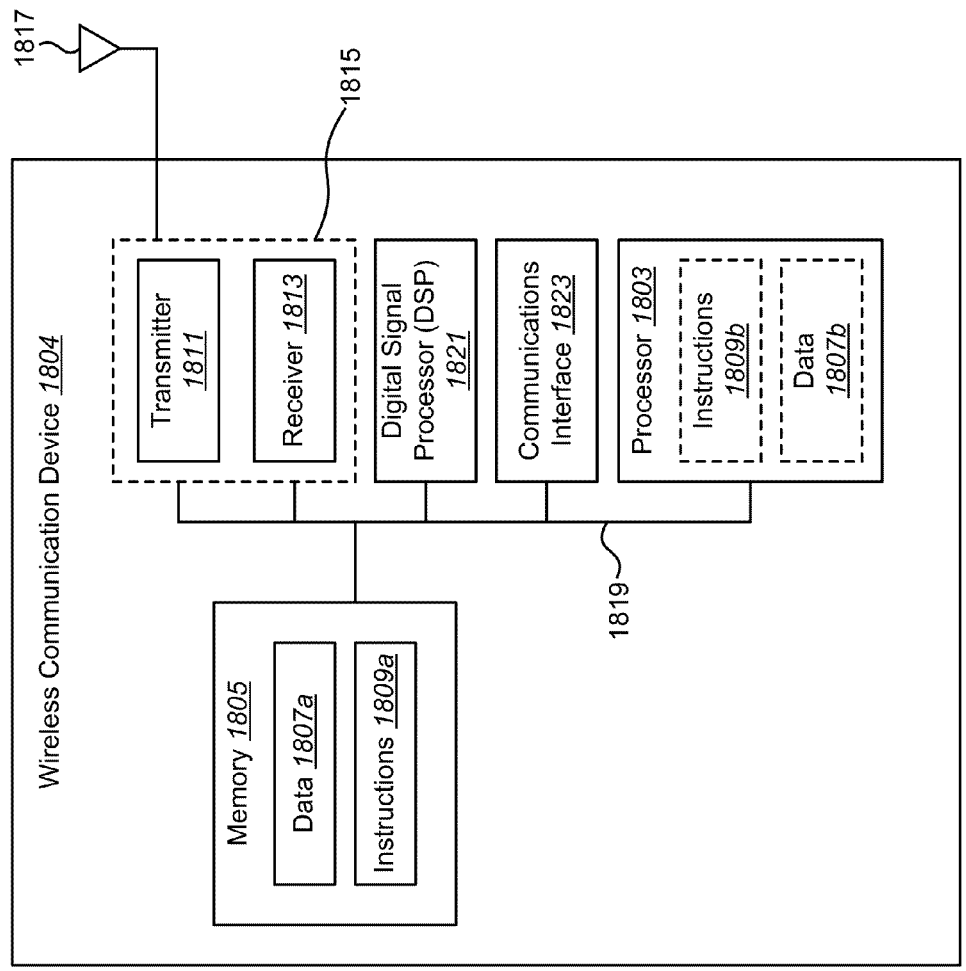
FIG. 18 illustrates certain components that may be included within a wireless communication device.

FIG. 18 illustrates certain components that may be included within a wireless communication device 1804. The wireless communication device 1804 may be an access terminal, a mobile station, a user equipment (UE), etc. The wireless communication device 1804 includes a processor 1803. The processor 1803 may be a general purpose single- or multi-chip microprocessor (e.g., an ARM), a special purpose microprocessor (e.g., a digital signal processor (DSP)), a microcontroller, a programmable gate array, etc. The processor 1803 may be referred to as a central processing unit (CPU). Although just a single processor 1803 is shown in the wireless communication device 1804 of FIG. 18, in an alternative configuration, a combination of processors (e.g., an ARM and DSP) could be used.

The wireless communication device 1804 also includes memory 1805. The memory 1805 may be any electronic component capable of storing electronic information. The memory 1805 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 1807*a* and instructions 1809*a* may be stored in the memory 1805. The instructions 1809*a* may be executable by the processor 1803 to implement the methods disclosed herein. Executing the instructions 1809*a* may involve the use of the data 1807*a* that is stored in the memory 1805. When the processor 1803 executes the instructions 1809, various portions of the instructions 1809*b* may be loaded onto the processor 1803, and various pieces of data 1807*b* may be loaded onto the processor 1803.

The wireless communication device 1804 may also include a transmitter 1811 and a receiver 1813 to allow transmission and reception of signals to and from the wireless communication device 1804 via an antenna 1817. The transmitter 1811 and receiver 1813 may be collectively referred to as a transceiver 1815. The wireless communication device 1804 may also include (not shown) multiple transmitters, multiple antennas, multiple receivers and/or multiple transceivers.

The wireless communication device 1804 may include a digital signal processor (DSP) 1821. The wireless communication device 1804 may also include a communications interface 1823. The communications interface 1823 may allow a user to interact with the wireless communication device 1804.

The various components of the wireless communication device 1804 may be coupled together by one or more buses, which may include a power bus, a control signal bus, a status signal bus, a data bus, etc. For the sake of clarity, the various buses are illustrated in FIG. 18 as a bus system 1819.

Figure 19:
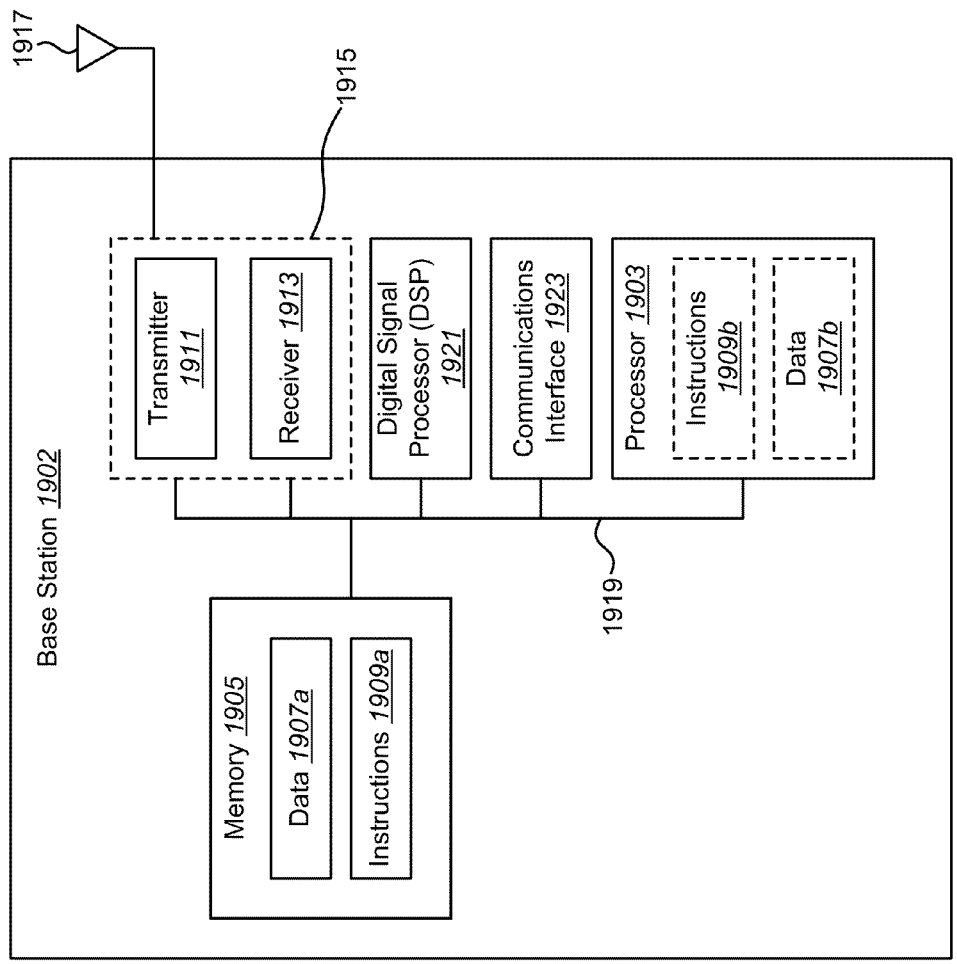
FIG. 19 illustrates certain components that may be included within a base station.

FIG. 19 illustrates certain components that may be included within a base station 1902. The base station 1902 of FIG. 19 may be one configuration of the wireless device 102 of FIG. 1. A base station may also be referred to as, and may include some or all of the functionality of, an access point, a broadcast transmitter, a NodeB, an evolved NodeB, etc. The base station 1902 includes a processor 1903. The processor 1903 may be a general purpose single- or multi-chip microprocessor (e.g., an ARM), a special purpose microprocessor (e.g., a digital signal processor (DSP)), a microcontroller, a programmable gate array, etc. The processor 1903 may be referred to as a central processing unit (CPU). Although just a single processor 1903 is shown in the base station 1902 of FIG. 19, in an alternative configuration, a combination of processors (e.g., an ARM and DSP) could be used.

The base station 1902 also includes memory 1905. The memory 1905 may be any electronic component capable of storing electronic information. The memory 1905 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1907a and instructions 1909a may be stored in the memory 1905. The instructions 1909a may be executable by the processor 1903 to implement the methods disclosed herein. Executing the instructions 1909a may involve the use of the data 1907a that is stored in the memory 1905. When the processor 1903 executes the instructions 1909a, various portions of the instructions 1909b may be loaded onto the processor 1903, and various pieces of data 1907b may be loaded onto the processor 1903.

The base station 1902 may also include a transmitter 1911 and a receiver 1913 to allow transmission and reception of signals to and from the base station 1902. The transmitter 1911 and receiver 1913 may be collectively referred to as a transceiver 1915. An antenna 1917 may be electrically coupled to the transceiver 1915. The base station 1902 may also include (not shown) multiple transmitters, multiple receivers, multiple transceivers and/or multiple antennas.

The base station 1902 may include a digital signal processor (DSP) 1921. The base station 1902 may also include a communications interface 1923. The communications interface 1923 may allow a user to interact with the base station 1902.

The various components of the base station 1902 may be coupled together by one or more buses, which may include a power bus, a control signal bus, a status signal bus, a data bus, etc. For the sake of clarity, the various buses are illustrated in FIG. 19 as a bus system 1919.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The systems and methods discussed herein may be realized using any technology that is tunable, such as tunable circuits using variable capacitance junction diodes, varactors, CMOS transistors, switches or tunable microelectromechanical systems (MEMS).

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 5, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A wireless device comprising:
  a tunable front end module, comprising:
    a Tx microelectromechanical system bandpass filter; and
    a first Rx microelectromechanical system bandpass filter;
  a power amplifier; and
  a low noise amplifier,
  wherein the power amplifier is a distributed gain power amplifier that comprises:
    a Tx driver integrated on a radio frequency integrated circuit;
    a low gain power amplifier;
    a Tx driver filter coupled between the Tx driver and the low gain power amplifier; and
    a Tx filter coupled to an output of the low gain power amplifier.

2. The wireless device of claim 1, wherein the tunable front end module further comprises a microelectromechanical system duplexer.

3. The wireless device of claim 2, wherein the microelectromechanical system duplexer comprises a first tunable filter for Tx and a second tunable filter for Rx, and wherein the first tunable filter and the second tunable filter use microelectromechanical system technology.

4. The wireless device of claim 3, wherein the power amplifier is coupled between the Tx microelectromechanical system bandpass filter and the first tunable filter, and wherein the low noise amplifier is coupled between the first Rx microelectromechanical system bandpass filter and the second tunable filter.

5. The wireless device of claim 3, wherein the first tunable filter and the second tunable filter are coupled to an antenna.

6. The wireless device of claim 1, further comprising a radio frequency integrated circuit that comprises:
  a driver amplifier; and
  a post-LNA amplifier.

7. The wireless device of claim 6, wherein the driver amplifier is tunable to provide higher gain to narrower chunks of bandwidth.

8. The wireless device of claim 6, wherein the post-LNA amplifier is tunable to provide higher gain to narrower chunks of bandwidth.

9. The wireless device of claim 1, wherein the power amplifier is integrated with the tunable front end module.

10. The wireless device of claim 1, wherein the low noise amplifier is integrated with the tunable front end module.

11. A wireless device comprising:
  a tunable front end module, comprising:
    a Tx microelectromechanical system bandpass filter; and
    a first Rx microelectromechanical system bandpass filter;
  a power amplifier; and
  a low noise amplifier;
  wherein the low noise amplifier is a distributed gain low noise amplifier that comprises:
    a post-LNA amplifier integrated on a radio frequency integrated circuit;
    a low gain low noise amplifier;
    an Rx post-LNA filter coupled between the post-LNA amplifier and the low gain low noise amplifier; and
    an Rx filter coupled to an input of the low gain low noise amplifier.

12. The wireless device of claim 1, wherein the low noise amplifier and the power amplifier are integrated with the tunable front end module.

13. The wireless device of claim 12, wherein the Tx microelectromechanical system bandpass filter and the first Rx microelectromechanical system bandpass filter are integrated on a radio frequency integrated circuit.

14. The wireless device of claim 13, wherein the low noise amplifier is integrated on the radio frequency integrated circuit.

15. The wireless device of claim 13, wherein the power amplifier is integrated on the radio frequency integrated circuit.

16. The wireless device of claim 1, wherein the power amplifier is tunable to provide higher gain to narrower chunks of bandwidth.

17. The wireless device of claim 16, wherein the power amplifier has higher efficiency and better matching to the antenna because an output filter is not used.

18. The wireless device of claim 16, wherein the power amplifier emits less, since the response of the power amplifier is the same as a bandpass filter.

19. The wireless device of claim 16, wherein the power amplifier improves Rx/Tx isolation, since the bandwidth is narrower and rejection is increased.

20. The wireless device of claim 1, wherein the low noise amplifier is tunable to provide higher gain to narrower chunks of bandwidth.

21. The wireless device of claim 20, wherein the low noise amplifier allows for the relaxation of specifications for an input filter.

22. The wireless device of claim 21, wherein the low noise amplifier has higher efficiency and lower noise figures because the low noise amplifier is better matched to the input filter and since the specification for the input filter are relaxed.

23. The wireless device of claim 20, wherein the low noise amplifier has a response that is the same as a bandpass filter.

24. The wireless device of claim 20, wherein the low noise amplifier improves Rx/Tx isolation, since the bandwidth is narrower and rejection is increased.

25. The wireless device of claim 1, further comprising:
a microelectromechanical system RF switch; and
multiple Rx surface acoustic wave duplexers, wherein the microelectromechanical system RF switch couples the low noise amplifier to an antenna via one of the multiple Rx surface acoustic wave duplexers.

26. The wireless device of claim 25, further comprising:
a Tx band select microelectromechanical system switch; and
multiple Tx surface acoustic wave duplexers, wherein the Tx band select microelectromechanical system switch couples the power amplifier to the antenna via one of the multiple Tx surface acoustic wave duplexers.

27. The wireless device of claim 1, further comprising:
a first antenna;
a second Rx microelectromechanical bandpass filter coupled between the first antenna and the first microelectromechanical bandpass filter; and
a second antenna coupled to an output of the power amplifier.

28. A method for wireless communications, comprising:
receiving a receive signal;
routing the receive signal through a first Rx microelectromechanical bandpass filter in a tunable front end module;
providing the receive signal to a modem;
receiving a transmit signal from the modem;
routing the transmit signal through a Tx microelectromechanical bandpass filter in the tunable front end module; and
transmitting the transmit signal;
wherein the method is performed by a wireless device that comprises the tunable front end module, and wherein the tunable front end module comprises:
a power amplifier; and
a low noise amplifier; and
wherein the power amplifier is a distributed gain power amplifier that comprises:
a Tx driver integrated on a radio frequency integrated circuit;
a low gain power amplifier;
a Tx driver filter coupled between the Tx driver and the low gain power amplifier; and
a Tx filter coupled to an output of the low gain power amplifier.

29. The method of claim 28, wherein the tunable front end module further comprises a microelectromechanical system duplexer.

30. The method of claim 29, wherein the microelectromechanical system duplexer comprises a first tunable filter for Tx and a second tunable filter for Rx, and wherein the first tunable filter and the second tunable filter use microelectromechanical system technology.

31. The method of claim 30, wherein the power amplifier is coupled between the Tx microelectromechanical system bandpass filter and the first tunable filter, and wherein the low noise amplifier is coupled between the first Rx microelectromechanical system bandpass filter and the second tunable filter.

32. The method of claim 30, wherein the first tunable filter and the second tunable filter are coupled to an antenna.

33. The method of claim 28, further comprising a radio frequency integrated circuit that comprises:
a driver amplifier; and
a post-LNA amplifier.

34. The method of claim 33, wherein the driver amplifier is tunable to provide higher gain to narrower chunks of bandwidth.

35. The method of claim 33, wherein the post-LNA amplifier is tunable to provide higher gain to narrower chunks of bandwidth.

36. The method of claim 28, wherein the power amplifier is integrated with the tunable front end module.

37. The method of claim 28, wherein the low noise amplifier is integrated with the tunable front end module.

38. A method for wireless communications, comprising:
receiving a receive signal;
routing the receive signal through a first Rx microelectromechanical bandpass filter in a tunable front end module;
providing the receive signal to a modem;
receiving a transmit signal from the modem;
routing the transmit signal through a Tx microelectromechanical bandpass filter in the tunable front end module; and
transmitting the transmit signal;
wherein the method is performed by a wireless device that comprises the tunable front end module, and wherein the tunable front end module comprises:
a power amplifier; and
a low noise amplifier; and
wherein the low noise amplifier is a distributed gain low noise amplifier that comprises:
a post-LNA amplifier integrated on a radio frequency integrated circuit;
a low gain low noise amplifier;
an Rx post-LNA filter coupled between the post-LNA amplifier and the low gain low noise amplifier; and
an Rx filter coupled to an input of the low gain low noise amplifier.

39. The method of claim 28, wherein the low noise amplifier and the power amplifier are integrated with the tunable front end module.

40. The method of claim 39, wherein the Tx microelectromechanical system bandpass filter and the first Rx microelectromechanical system bandpass filter are integrated on a radio frequency integrated circuit.

41. The method of claim 40, wherein the low noise amplifier is integrated on the radio frequency integrated circuit.

42. The method of claim 40, wherein the power amplifier is integrated on the radio frequency integrated circuit.

43. The method of claim 28, wherein the power amplifier is tunable to provide higher gain to narrower chunks of bandwidth.

44. The method of claim 43, wherein the power amplifier has higher efficiency and better matching to the antenna because an output filter is not used.

45. The method of claim 43, wherein the power amplifier emits less, since the response of the power amplifier is the same as a bandpass filter.

46. The method of claim 43, wherein the power amplifier improves Rx/Tx isolation, since the bandwidth is narrower and rejection is increased.

47. The method of claim 28, wherein the low noise amplifier is tunable to provide higher gain to narrower chunks of bandwidth.

48. The method of claim 47, wherein the low noise amplifier allows for the relaxation of specifications for an input filter.

49. The method of claim 48, wherein the low noise amplifier has higher efficiency and lower noise figures because the low noise amplifier is better matched to the input filter and since the specification for the input filter are relaxed.

50. The method of claim 47, wherein the low noise amplifier has a response that is the same as a bandpass filter.

51. The method of claim 47, wherein the low noise amplifier improves Rx/Tx isolation, since the bandwidth is narrower and rejection is increased.

52. The method of claim 28, wherein the wireless device further comprises:
a microelectromechanical system RF switch; and
multiple Rx surface acoustic wave duplexers, wherein the microelectromechanical system RF switch couples the low noise amplifier to an antenna via one of the multiple Rx surface acoustic wave duplexers.

53. The method of claim 52, wherein the wireless device further comprises:
a Tx band select microelectromechanical system switch; and
multiple Tx surface acoustic wave duplexers, wherein the Tx band select microelectromechanical system switch couples the power amplifier to an antenna via one of the multiple Tx surface acoustic wave duplexers.

54. The method of claim 28, wherein the wireless device further comprises:
a first antenna;
a second Rx microelectromechanical bandpass filter coupled between the first antenna and the first microelectromechanical bandpass filter; and
a second antenna coupled to an output of the power amplifier.

55. The method of claim 28, wherein the wireless device is a wireless communication device.

56. The method of claim 28, wherein the wireless device is a base station.

57. An apparatus for wireless communications, comprising:
means for receiving a receive signal;
means for routing the receive signal through a first Rx microelectromechanical bandpass filter in a tunable front end module;
means for providing the receive signal to a modem;
means for receiving a transmit signal from the modem;
means for routing the transmit signal through a Tx microelectromechanical bandpass filter in the tunable front end module; and
means for transmitting the transmit signal;
wherein the tunable front end module comprises:
a power amplifier; and
a low noise amplifier; and
wherein the power amplifier is a distributed gain power amplifier that comprises:
a Tx driver integrated on a radio frequency integrated circuit;
a low gain power amplifier;
a Tx driver filter coupled between the Tx driver and the low gain power amplifier; and
a Tx filter coupled to an output of the low gain power amplifier.

58. The apparatus of claim 57, wherein the tunable front end module further comprises a microelectromechanical system duplexer.

59. The apparatus of claim 58, wherein the microelectromechanical system duplexer comprises a first tunable filter for Tx and a second tunable filter for Rx, and wherein the first tunable filter and the second tunable filter use microelectromechanical system technology.

60. A computer-program product for wireless communications, the computer-program product comprising a non-transitory computer-readable medium having instructions thereon, the instructions comprising:
code for causing a wireless device to receive a receive signal;
code for causing the wireless device to route the receive signal through a first Rx microelectromechanical bandpass filter in a tunable front end module;
code for causing the wireless device to provide the receive signal to a modem;
code for causing the wireless device to receive a transmit signal from the modem;
code for causing the wireless device to route the transmit signal through a Tx microelectromechanical bandpass filter in the tunable front end module; and
code for causing the wireless device to transmit the transmit signal,
wherein the tunable front end module comprises:
a power amplifier; and
a low noise amplifier; and
wherein the power amplifier is a distributed gain power amplifier that comprises:
a Tx driver integrated on a radio frequency integrated circuit;
a low gain power amplifier;
a Tx driver filter coupled between the Tx driver and the low gain power amplifier; and
a Tx filter coupled to an output of the low gain power amplifier.

61. The computer-program product of claim 60, wherein the tunable front end module further comprises a microelectromechanical system duplexer.

62. The computer-program product of claim 61, wherein the microelectromechanical system duplexer comprises a first tunable filter for Tx and a second tunable filter for Rx, and wherein the first tunable filter and the second tunable filter use microelectromechanical system technology.

* * * * *